United States Patent [19]

Shenton

[11] Patent Number: 4,637,021
[45] Date of Patent: Jan. 13, 1987

[54] MULTIPLE PASS ERROR CORRECTION
[75] Inventor: David N. Shenton, Monroeville, Pa.
[73] Assignee: Pioneer Electronic Corporation, Tokyo, Japan
[21] Appl. No.: 536,666
[22] Filed: Sep. 28, 1983
[51] Int. Cl.[4] ............................................. G06F 11/10
[52] U.S. Cl. .......................................... 371/37; 371/40
[58] Field of Search ..................... 371/37, 38, 39, 40, 371/43, 50, 53

[56] References Cited

U.S. PATENT DOCUMENTS

| 2,977,047 | 3/1961 | Bloch | 371/53 |
|---|---|---|---|
| 3,200,374 | 8/1965 | Ballard | 371/50 |
| 3,831,144 | 8/1974 | En | 371/50 |
| 4,044,328 | 8/1977 | Herff | 371/50 |
| 4,201,976 | 5/1980 | Patel | 371/50 |
| 4,205,324 | 5/1980 | Patel | 371/50 |
| 4,306,305 | 12/1981 | Toshitada et al. | 371/38 |
| 4,354,269 | 10/1983 | Vries et al. | 371/43 |
| 4,380,071 | 4/1983 | Odaka | 371/40 |
| 4,398,292 | 8/1983 | Doi et al. | 371/39 |
| 4,413,340 | 11/1983 | Odaka et al. | 371/39 |
| 4,437,185 | 3/1984 | Sako et al. | 371/37 |
| 4,468,769 | 8/1984 | Koga | 371/37 |
| 4,497,058 | 1/1985 | Sako et al. | 371/37 |
| 4,498,175 | 2/1985 | Nagumo et al. | 371/37 |

OTHER PUBLICATIONS

Doi et al, "A Long-Play Digital Audio Disc System"; Manuscript of a talk presented at the 62nd Convention of Audio Eng Society, May 6-9, 1980.
Yamada et al, "Professional-Use PCM Audio Processor with a High Efficiency Error Correction System", Manuscript of a talk presented at the 66th Convention of the Audio Eng Society, Mar. 13-16, 1979.
Cross Interleave Code for Error Correction of Digital Audio Systems (Doi, Fukuda, and Furukawa)(an abstract presented at 64th Convention of Audio Engineering Soc., Nov. 4, 1979).
The Compact Disc Audio System: Modulation and Error Correction, (Vries, Immink, Nijboer, Hoeve, Doi, Odaka, Ogawa) abstract presented at 67th Conv. of Audio Engineering Society, Oct. 31, 1980.
LSIs for Digital Signal Processing to be Used in 'Compact Disc Digital Audio' Players, (Odaka, Furuya, Tako) Abstract presented at 71st Convention of Audio Engineering Society, Mar. 2, 1982.
G. David Forney, Jr.—Burst-Correcting Codes for the Classic Burst-Channel, IEEE Transactions on Communications Technology, May, 1971, pp. 772-781.
Hans J. Matt and James L. Massey, Determining the Burst-Correcting Limit of Cyclic Codes; IEEE Transactions on Information Theory, vol. IT-26, No. 3, May, 1980, pp. 289-297.
D. T. Brown, F. F. Sellers, Jr.—Error Correction for IBM 800-bit-per-inch Magnetic Tape, IBM Res. Develop., Jul. 1970, pp. 384-389.
A. M. Patel, S. J. Hong—Optimal Rectangular Code for High Density Magnetic Tapes, IBM J. Res. Develop., Nov. 1970, pp. 579-587.

Primary Examiner—Michael R. Fleming
Attorney, Agent, or Firm—Christie, Parker & Hale

[57] ABSTRACT

A method and apparatus for detection and correction of errors in encoded digital data arranged in bytes is disclosed using a digital data processor for correcting errors in original digital data bytes organized into blocks each containing a plurality of bytes, each block containing information data bytes and parity data bytes. The original digital data bytes containing errors are processed a block at a time with a first decoder, thereby correcting errors in the original digital data bytes, to form first corrected digital data bytes. The first corrected digital data bytes include the same number of bytes as in the sets of the original data bytes. Second sets of digital data bytes from the first corrected digital data bytes are processed with a second decoder to form further corrected digital data bytes. The digital data bytes to be processed by one of the first and second decoders are de-interleaved before processing by such decoders so that the digital data bytes are processed by one of the first and second decoders in a different sequence than by the other decoder. In the further corrected digital data bytes following the first and second steps of processing, the same number of digital data bytes are retained as in the sets of the original digital data. The previously recited two steps of processing and the step of de-interleaving are repeated a second time using, in place of the original digital data, the retained further corrected digital data bytes to thereby further eliminate errors in the original digital data bytes.

34 Claims, 29 Drawing Figures

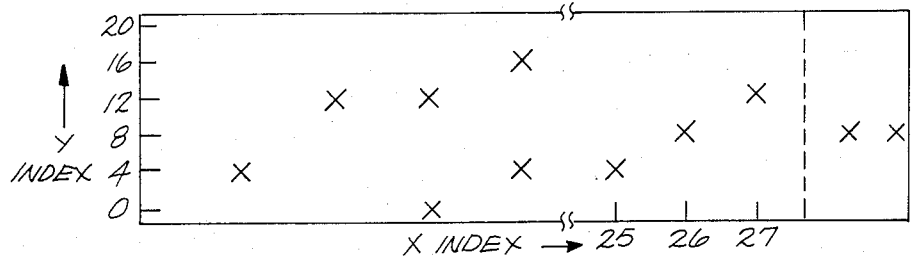
Fig. 25A ORIGINAL DATA
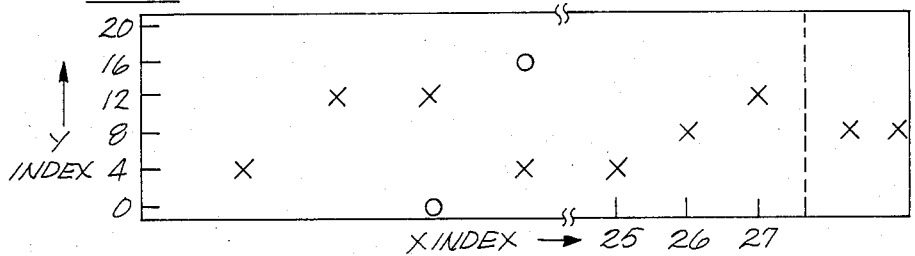
Fig. 25B 1ST. C1
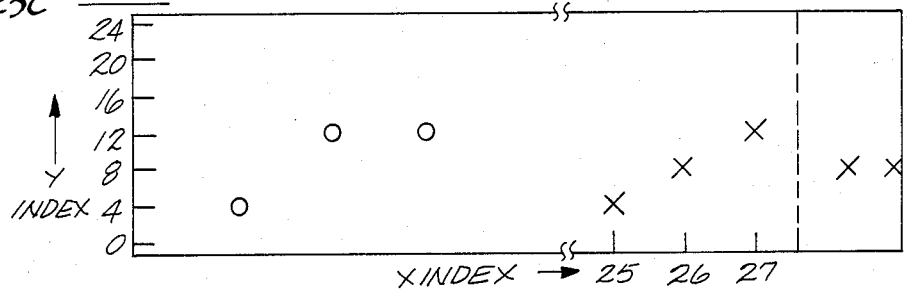
Fig. 25C 1ST C2
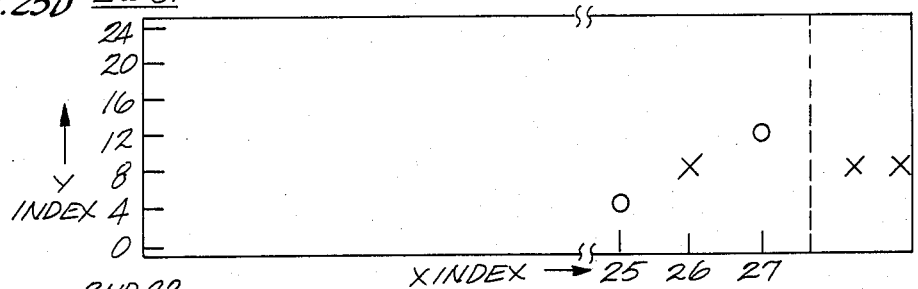
Fig. 25D 2ND C1
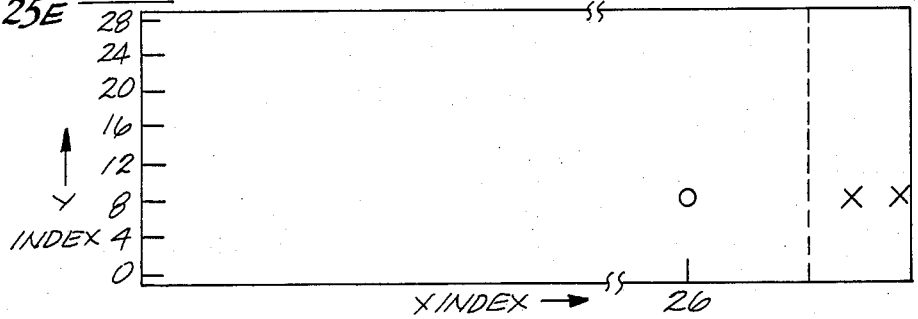
Fig. 25E 2ND C2

MULTIPLE PASS ERROR CORRECTION

BACKGROUND OF THE INVENTION

This invention relates to digital communication; more particularly it relates to a method and apparatus for the detection and correction of errors in digital data occurring during communication of the data. Communication is used in the broad sense to include transmission over conductors, telephone lines and the like, radio and television broadcasting and digital data signal recording and playback.

There has been a demand for increased quality of audio recording and read back systems as well as in other types of communications. One type of audio recording and read back system takes analog audio signals, converts the signals to digital form, records the digital form of signals on a recording media, reads back the digital form of signals, converts the digital form of the signals to analog form, and then applies the analog form of the signals to an audio speaker. Modern systems record the digital data on a variety of recording media. One high quality recording media is an optical disk.

One problem with recording media is that there are defects in the media and as a result there are areas where the digital data is not recorded properly or cannot be reliably read back and as a result errors occur in the digital read back data. Errors also occur in transmissions of digital data. During recording, read back and transmission of digital data, errors occur in the digital data with some finite probability. The data is typically composed of binary units, a group of binary bits (such as 8) make up a data "byte", and groups of bytes (such as 2) make up a data "word". Additionally the data is arranged into "blocks" of data (such as 32 or 28 byte blocks). The errors which occur are considered to be of two types, although there is undoubtedly some overlap between the two. The first such type is a single bit error, which is the substitution of one of two possible values of a binary bit for its opposite value. Such errors usually occur randomly in a digital signal. A second type of error consists of a continuous sequence of erroneous bits. Such errors are referred to as "burst errors." The length of these bursts and their frequency of occurrence are also random.

An approach to the inevitable occurrence of errors in a digital signal is to include additional or redundant bits in the signal which will allow for detection and correction of such errors. The process whereby such redundant bits are added to information is called encoding; the information bits plus redundant bits form the code. The costs of such a strategy are increased time for processing the data after transmission, the extra equipment needed and the decrease in the amount of information which can be transmitted per unit time because of the extra bits included for error detection and correction. As the number of errors which can be corrected by any code increases, the number of bits which must be added to the data to enable such correction also increases. Accordingly, there has been considerable effort directed to finding efficient codes. Efficiency in this context is measured by the ratio of information or data bytes to data bytes plus data correction or "parity" bytes; it is also measured by the number of errors which can be corrected (typically expressed as the number of errors remaining after correction for an assumed initial error frequency). From a theoretical viewpoint, it has been found that the Reed-Solomon class of block codes are among the most efficient coding schemes yet devised. The efficiency of any code, in practical use, also depends on the implementing equipment.

In recent years there has been great interest in utilizing Reed-Solomon codes for recording, read back and transmission of audio information, especially in the recording industry, where high fidelity is at a premium. For example, Vries et al. describes a digital audio disk system in a paper entitled *The Compact Disc Digital Audio System* (Abstract 1674 [H-8]), presented at the 67th Convention of the Audio Engineering Society) wherein audio data was encoded in a crossinterleaved Reed-Solomon code (CIRC) and stored on a small optical disk. An improved method employing the same coding scheme referred to as the Super Strategy, was presented in 1982 by Odaka, et al. at the 71st Convention of the Audio Engineering Society in a paper entitled *LSI For Digital Signal Processing To Be Used in Compact Disc Digital Audio Players* (Abstract 1860 [G-5]).

In implementing the CIRC, Odaka discloses that digitized data is, as a first step, expressed in of elements of a finite field. Such representations are termed Galois numbers. The relationship between the original data and its corresponding Galois representation is specified by a primitive polynomial, which is chosen from among a plurality of known primitive polynomials and is described by way of example by Peterson and Weldon in a book entitled *Error Correcting Codes*, published in 1972 by the MIT Press. Each data element is a representation of a coefficient of a power of an irreducible root of the chosen primitive polynomial. This root is commonly indicated as $\alpha$. The CIRC then utilizes a two-step encoding process. In passing through the first encoder, 24 consecutive data bytes which are representations of a data polynomial are divided by a generator polynomial. The generator polynomial is also a function of the root $\alpha$. In the process, four parity bytes are added. The result is a block of 24 data bytes and 4 parity bytes. This consecutive sequence of bytes is interleaved or dispersed among other encoded data bytes. The interleaved data is passed through the second encoder. The second encoder is identical to the first except that the bytes are presented in a different sequence because of interleaving, parity bytes together with data bytes are being encoded, blocks of 28 bytes (24 data bytes plus 4 parity bytes) are being encoded instead of 24 byte blocks, and 4 additional parity bytes are added. The result of the second encoding process is a 32 byte block composed of 24 data bytes and 8 parity bytes.

The encoded data is optically recorded and subsequently read back. After the encoded data is read back, there will be data errors due to recording, read back or transmission problems. The parity symbols in the data are then used to detect and correct any errors which may have occurred. Such errors may occur in the information or in the parity symbols. In the system reported in the Odaka papers (supra), two separate decoders, C1 and C2, are used to decode the previously encoded data. Thirty-two consecutive data bytes (a C1 block) are divided by a generator polynomial in the C1 decoder. Using the remainders resulting from this division the C1 decoder is able to correct up to two errors in the 28 high order bytes. Significantly, the 4 low order parity bytes are discarded and the remaining bytes are de-interleaved using delay lines implemented by shift registers. Only the 28 remaining bytes (a C2 block) are then decoded by a C2 decoder. Both the C1 and C2 decoders set erasure flags for each byte in blocks where an error pattern cannot be corrected or where it is determined that there is reason to doubt that a particular correction is in fact correct. The erasure flags are utilized in subsequent steps to conceal these errors by interpolation or by repeating the data bytes in the immediately preceding data block to cover the block in error.

The Odaka method does not fully utilize the error detection and correction capabilities of the CIRC code. For example, errors may occur in the 4 lowest order parity bytes of a C1 block. Since these are only treated as parity bytes by the C1 decoder (i.e., they are never corrected by it) and are discarded before reaching the C2 decoder, such errors are never correctable. Such incorrect parity bytes will result in miscorrection (erroneous changes) of data bytes by the C1 decoder and ultimately degrade the performance of the code.

SUMMARY OF THE INVENTION

It has been found that substantial improvement in the fraction of errors that can be successfully corrected can be effected by processing an incoming digital data stream through C1 and C2 decoders in two passes. That is, processing the data with a C1 decoder, then a C2 decoder, then processing the same data again by the two decoders in the same sequence. In order to accomplish this increased processing, new methods for implementing the C1 and C2 decoding and the de-interleaving processes are required.

In comparison with the above described prior art, an embodiment of the present invention takes better advantage of the information content of the encoded data, being able to correct errors in all parity bytes of any block of data. The multiple pass feature allows correction of error patterns uncorrectable by prior art methods.

Briefly, the disclosed embodiment of the invention involves, at the C1 decoder, calculation of a representation of the number of errors, the location of the errors and the nature of the errors in a first block of consecutive data bytes. The representation described above is termed a syndrome. This calculation is performed by forming the Galois product of the byte in a first memory location and an irreducible root (hereinafter $\alpha$) of a primitive polynomial to the 0 power (i.e., $\alpha^0$). The product is then summed with the byte stored in a second memory location and this sum is multiplied by $\alpha$. Subsequently this process is repeated to form a sum of the products of $\alpha^0$ and the bytes in each memory location of a data block. The result is a first syndrome.

A second syndrome is calculated using the method described for the first one, except that the value $\alpha^0$ is replaced by $\alpha^1$. Similarly a third syndrome formed by the same method is calculated, replacing the value of $\alpha^0$ used in calculating the first syndrome by $\alpha^2$. A fourth syndrome is also formed, replacing the value of $\alpha$ used in calculating the first syndrome by $\alpha^3$.

A general expression for the syndromes is:

$$S_J = L_0 * \alpha^{J \cdot (31)} + L_1 * \alpha^{J \cdot (30)} + \ldots L_{30} * \alpha^{J \cdot (1)} + L_{31} * \alpha^0 \quad \text{Equation (1)}$$

where J is the syndrome (J+0 to 3), L is the data byte and * indicates Galois multiplication. The symbol for ordinary multiplication is ".". Galois multiplication is also implied by the lack of either "*" or "·" in an equation. It should also be noted that exponents indicate Galois multiplication of the base and that any addition within exponents is regular addition.

Significantly, this method of calculating a syndrome is extremely fast. Each product and partial sum is formed together in a single machine cycle.

By way of comparison, this method replaces the prior art method of calculating a first syndrome wherein a data polynomial is divided by the generator polynomial for the particular code. The data polynomial for the Reed-Solomon codes is $D = L_0 * X^{31} + L_1 * X^{30} + \ldots L_{31} * X^0$. The generator polynomial for the Reed-Solomon codes is $(X + \alpha^0) * (X + \alpha^1) * (X + \alpha^2) * \ldots (X + \alpha^{N-1})$ where X is any element of the Galois field and N is the number of parity bytes in the block. The syndromes obtained are the coefficients of the remainder resulting from the indicated division.

These four syndromes are used to determine the number of errors present in the data block being processed by the C1 decoder. If one or two errors are present, the locations of the errors are determined, as described in greater detail below, from the values of the syndromes. In the case of one error, correction of the erroneous data byte is accomplished by simply adding, using Galois addition, the value of the first syndrome to the data in locations determined to be in error. Correction of two errors is slightly more complicated and is described in more detail below. If more than two errors are detected, error correction cannot be accomplished by the first C1 decoder. All data bytes in the block are then marked with an additional bit, termed an erasure flag.

Before processing by the C2 decoder, it is necessary to rearrange the data bytes by de-interleaving. An embodiment of the present invention accomplishes de-interleaving by simply forming a second data block (the C2 block) from 28 data bytes selected from among a larger group located in the system memory.

Significantly, this method of de-interleaving allows different data bytes to be selected for processing by the C2 decoder without discarding any of those already processed by the C1 decoder. Since all data bytes of the first group are returned for further processing, it is possible to correct any group of data, including information and parity data bytes, with both the C1 and C2 decoders more than once. That is to say, it is possible to implement multiple pass decoding.

The method of the C2 decoder is similar to that of the C1 decoder except that all bytes, including information and parity data bytes, which are processed by the C2 decoder have already been processed by the C1 decoder and the bytes processed are not from consecutive locations in memory. Because of the de-interleaving step between the C1 and C2 decoders, data bytes which cannot be corrected by the C1 decoder may be corrected by the C2 decoder since the erroneous bytes will be dispersed among several C2 blocks including other data bytes. As a result the number of errors in a C2 data block may be lower than the number of errors in a C1 data block. This is likely in fact when a burst error corrupts several consecutive bytes in a C1 block. Since all of the erroneous bytes will no longer be present in a single C1 block, they may be correctable.

To further illustrate the advantages of the disclosed embodiment of the invention, it has been found that in a simulation of noisy input data the method disclosed herein results in a threefold improvement in the number of erroneous error bytes corrected, as compared with prior art methods.

A further significant aspect of the disclosed embodiment of the invention is that the uncorrectable bytes of a C1 block can be corrected by the C2 decoder, and these corrected bytes can then be reused by the C1 decoder on the second and subsequent passes to effect further corrections on other data bytes.

After each byte in a plurality of bytes has been processed once by the C1 and C2 decoders, each byte is processed at least, but not limited to, one more time.

The disclosed embodiment uses a system memory large enough to store two C1 data blocks and two C2 data blocks, together with all data bytes in between each byte of each C2 data block. Preferably, data bytes are stored in the memory in the order in which they are received. Beginning at some arbitrary location in the memory, the first C1 decoder processes a C1 block of data bytes. The first C2 decoder then processes a C2 block of data bytes that has already been processed by the C1 decoder; this concludes the first pass. The addresses of the data bytes processed by each decoder are calculated as the sum of an offset selected for each decoder and a process counter which is incremented after a first pass and a second pass have been completed. A second C1 decoder processes data bytes that have already been processed by the first pass, and a second C2 decoder processes data bytes that have already been processed by the first pass and the second C1 decoder; this concludes the second pass. A decoder cycle comprises the execution of both a first pass and a second pass. At the conclusion of each decoder cycle, the aforementioned process counter is incremented, and the decoder cycle is repeated. New data is written into memory locations immediately ahead of the first C1 decoder, while corrected data bytes are read out from memory after having been processed by the second C2 decoder. The memory is circular; the lowest numbered memory address "follows" the highest numbered one. Thus in operation the reading of the four decoders continually advances through the memory until available data has been processed.

Briefly then a method is disclosed using a digital data processor for correcting errors in original digital data bytes organized into blocks each containing a plurality of bytes, each block containing information data bytes and parity data bytes. The method comprises the following steps. The original digital data bytes containing errors are processed a block at a time with a first decoder, thereby correcting errors in the original digital data bytes, to form first corrected digital data bytes. The first corrected digital data bytes include the same number of bytes as in the sets of the original data bytes. Second sets of digital data bytes from the first corrected digital data bytes are processed with a second decoder to form further corrected digital data bytes. The digital data bytes to be processed by one of the first and second decoders are de-interleaved before processing by such decoders so that the digital data bytes are processed by one of the first and second decoders in a different sequence than by the other decoder. In the further corrected digital data bytes following the first and second steps of processing, the same number of digital data bytes are retained as in the sets of the original digital data. The previously recited two steps of processing and the step of de-interleaving are repeated a second time using, in place of the original digital data, the retained further corrected digital data bytes to thereby further eliminate errors in the original digital data bytes. Preferably the steps of processing using the first and second decoders process digital data according to a Galois field. Preferably the step of processing the original digital data bytes and the first and further corrected digital data bytes includes the step of processing the digital data bytes from an addressable memory. Preferably the step of processing using the first decoder includes the step of processing the original digital data bytes in a sequence of blocks of digital data bytes. Preferably the step of processing using the second decoder includes the step of processing the second digital data bytes in a sequence of further blocks for digital data bytes and wherein the digital data bytes of the further blocks are each taken from digital data bytes making up different ones of the first named blocks.

A further method according to the present invention uses a digital data processor for correcting errors in digital data and comprises the following steps. The digital data containing the errors is stored in an addressable memory. A counter is selectively incremented through a sequence of states. The values represented by the status of the counter are combined with at least a first and second series of offset values to derive at least a first and second series of addresses. The first series of addresses is utilized to select, obtain from, and restore a first series of bytes of the data in memory. The bytes of data are processed with a first decoder to correct errors therein before they are restored. The second series of addresses is utilized to select, obtain from, and restore a second series of bytes of the data in memory. The second series of bytes of data include data after correction by the first decoder. The second bytes of data are processed with a second decoder to correct further errors therein before restoring.

Briefly a method embodying the invention uses a digital data processor for correcting errors in digital data. The steps of the method are as follows: store the digital data containing errors in an addressable memory. Selectively increment a counter through a sequence of states. Combine the values represented by the status of the counter with at least first and second series of offset values to derive at least first and second series of addresses. Utilize the first series of addresses to select, obtain from, and restore a first series of bytes of the data in the memory. Process the bytes of data with a first decoder to correct errors therein before they are restored. Utilize the second series of addresses to select, obtain from, and restore a second series of bytes of the data in the memory. The second series of bytes of data include data after correction by the first decoder. Process the second bytes of data with a second decoder to correct further errors therein before restoring.

Briefly a preferred embodiment of the invention is a method for correcting errors in digital data composed of first blocks and of second blocks. The first blocks each contain a fixed number of digital data bytes and the second blocks each contain a fixed number of digital data bytes. The information digital data bytes in each first block include digital data bytes from different ones of the second blocks and additional data bytes not in the second blocks. The method comprises the following steps. Decode the first blocks in sequence, correcting one or more errors in the digital data bytes in individual ones of the first blocks. Decode the second blocks in sequence, each second block being decoded after the digital data bytes thereof have been decoded as recited in the first recited step of decoding, correcting one or more additional errors in the digital data bytes of the second blocks. The first two recited decode steps are performed without discarding any of the digital data bytes included in each first block and each second block. Decode the first blocks sequentially. Each first block being decoded after the digital data bytes thereof have been decoded as recited in the first two recited decode steps, correcting one or more additional errors in the digital data bytes of the first blocks, retaining at least the digital data bytes of the first blocks that are included in second blocks. Decode the second blocks sequentially. Each individual second block is decoded after the digital data bytes thereof have been decoded as recited in the prior recited decode steps, correcting one or more additional errors in the information digital data bytes in the second blocks.

Briefly a method according to the present invention is for the detection and correction of errors in digital data arranged in bytes and encoded according to a BCH code. The steps of the method are as follows. For each data byte in a block of the encoded digital data, form the product in a Galois field of a first data byte and of a first power of a root of the primitive polynomial used in forming the encoded digital data block. Add in a Galois field the product formed in the previous step to another data byte of the encoded digital data to form a sum and form the product in a Galois field of the sum and the first power of the root of the primitive polynomial. Repeat the preceding add step for all data bytes in the encoded digital data block to form a first representation of the number of errors, the location of the errors and the nature of the errors in the encoded digital data block. Repeat the preceding three steps for a plurality of other powers of the root of the primitive polynomial in order to obtain plural representations of the number, location, and nature of errors in the encoded digital data block. Determine the number of errors in the encoded digital data block using the representation and plural representations formed in the add step and in the first recited repeat step. Locate the errors determined in the determine step in the encoded digital data block using the representations formed in the two repeat steps. Correct errors in the encoded digital data block located in the preceding locate step using the representations calculated in the two repeat steps. Preferably the digital data bytes are stored in a memory and are read from the memory during the step of forming the product. Preferably the state of a counter is incremented for each of the different powers and the states of the counter are used for selecting the power of the root of the primitive polynomial to be used. Also preferably a counter is incremented through a sequence of states corresponding to the individual digital data bytes and the states of the counter are utilized to select the corresponding digital data bytes from the memory. Preferably the BCH code is a Reed Solomon code. Preferably the method determines the representations formed during the repeat steps, which have values different from a predetermined value. It is determined whether ratios of the values of the representations have a further predetermined value. It is also determined whether a predetermined relationship exists between the representations resulting from the repeat steps and the locations of digital data bytes in the memory. The results of the preceding three recited steps are used for determining the number of errors in the digital data.

DESCRIPTION OF THE DRAWINGS

FIGS. 25A, 25B, 25C, 25D and 25E depict a representational example of the two pass decoding cycle showing how the data is corrected.

DETAILED DESCRIPTION

A. Encoding

There are a variety of techniques for including with transmitted digital information bytes, parity bytes which permit detection and correction of errors in the bytes. These techniques are referred to as coding. The parity bytes are calculated during the encoding process from the value of the information bytes to be transmitted. In the aggregate, the information and parity bytes are termed data bytes.

In the general class of codes known as the Bose-Chaudhuri-Hocquenghem codes (BCH codes), the information bytes as a first step are represented as elements of a Galois field. The particular representation is dependent on the primitive polynomial chosen to define the field. A detailed description of the primitive polynomials and the correspondence between data and its Galois representation may be found in Chapter 6 of *Error Correcting Codes* by Peterson and Weldon published by MIT Press which is incorporated herein by reference.

Typically, data is organized as a block wherein each block is chosen to include a fixed number of bytes. The data block may be represented as a polynomial of the form $$D = L_0 * X^{m+n-1} + L_1 * X^{m+n-2} + L_2 * X^{m+n-3} + \ldots L_{n-2} * X^{m+1} + L_{n-1} * X^m$$

where $L_0$ through $L_{n-1}$ are the data bytes in the data block, n is the number of data bytes in the data block, X is any element of the chosen Galois field, and m is the number of factors in the generator polynomial (to be described below).

The second step of the encoding process consistsd of dividing the data polynomial by a generator polynomial. In the BCH codes, the general form of this polynomial is $$G(X) = (X - \alpha^a) * (X - \alpha^b) \ldots * (X - \alpha^n)$$

where $\alpha$ is a primitive element which is a root of the primitive polynomial discussed previously and the exponents are chosen to create desired properties of the particular code. X, as before, is any element of the Galois field.

In the particular class of BCH codes known as Reed-Solomon codes, the exponents of the primitive element $\alpha$ are restricted to consecutive whole numbers beginning with 0.

The result of division of the data polynomial by the generator polynomial is a quotient consisting of the original data bytes and four parity bytes. The number of factors in the generator polynomial G(X) determines the number of parity bytes.

The second step of the encoding process, division of the data polynomial by the generator polynomial, may be repeated a number of times to create additional parity bytes. The advantage of this is to allow more complete correction of any errors that might have occurred during transmission.

In the Cross-Interleaved Reed Solomon Code described by Odaka, supra, this division is carried out twice.

B. System Components

Figure 1:
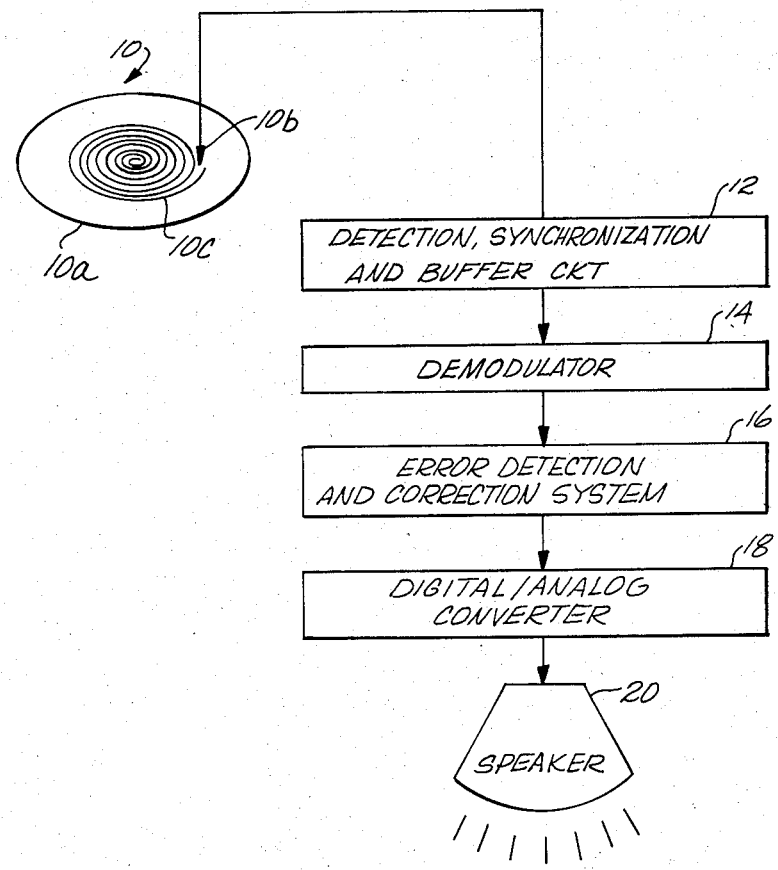
FIG. 1 is a block diagram of a digital audio disk and playback system and embodies the present invention system.

FIG. 1 is a schematic and block diagram showing the major components of a digital audio storage and read back system for audio signals and embodies the present invention.

A conventional optical disk player and laser beam transducer 10 detects audio signals encoded and recorded in digital form on a transparent audio disk 10a as variations in the optical reflectivity of the disk. The recorded signals are recovered from the disk 10a by converting these variations in optical reflectivity into a continuous series of digital signals, using a laser beam transducer system 10b which directs a laser beam at the surface of the disk and detects changes in the flux of photons returned by the disk. A sequence of data bytes is recorded in a continuous data stream spiral 10c on the surface of the disk; the disk is rotated in the playback mode, with the laser beam transducer system 10b tracking the spiral so as to continuously read a data stream.

The data stream is next directed to a detection, synchronization and buffer circuit 12. The detection, synchronization and buffer circuits 12 contain circuits (not shown) known in the art for shaping and detection of individual bits of data in the data stream from transducer 10b, and for buffering the shaped and detected bits of data before being presented to a demodulator 14.

Extra timing and synchronizing bits are included in the data. This is accomplished by mapping every 8 data bits into 14 bits on the disk. During playback, these extra timing and synchronizing bits are demodulated and thereby removed by demodulator 14 using circuits (not shown) known in the art. Following demodulation, the data stream consists of a series of 8 bit bytes.

An error detection and correction system includes logical components (not shown) which enable it to process multiple input channels, as for example, two or more channels of stereophonic music, in a continuous stream of data bytes without disturbing the continuous nature of the sound encoded therein. Following correction (as described in greater detail below), the data is reformed in system 16 into a continuous digital signal, is converted to analog form by a digital-to-analog converter 18 and finally converted into sound by a speaker 20.

Figure 2:
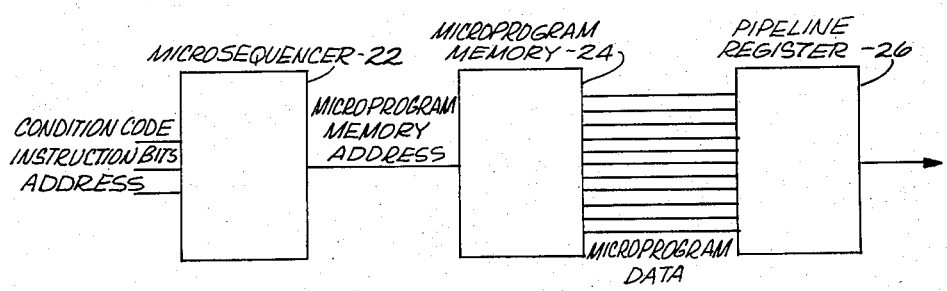
FIGS. 2 and 3 form a simplified schematic and block diagram of the error detection and correction system of FIG. 1.

Refer now to the error detection and correction system 16. System 16 consists of programmable computer hardware components depicted in FIGS. 2-8 together with stored computer programming the resulting operation of which is depicted by the flow diagrams of FIGS. 9-23. Referring to FIG. 2, the operation of the system 16 is controlled by a microsequencer 22 which selects appropriate instructions from a microprogram memory 24 for control of other hardware elements of the system 16. To achieve the highest possible rate of instruction execution, in a preferred embodiment of the invention, a pipelining technique is used. Briefly, while one instruction is being executed, the microsequencer 22 and microprogram memory 24 are forming the next instruction. The instructions in pipeline register 26 control the operation of other parts of the system 16 as described with reference to the flow diagrams.

Figure 3:
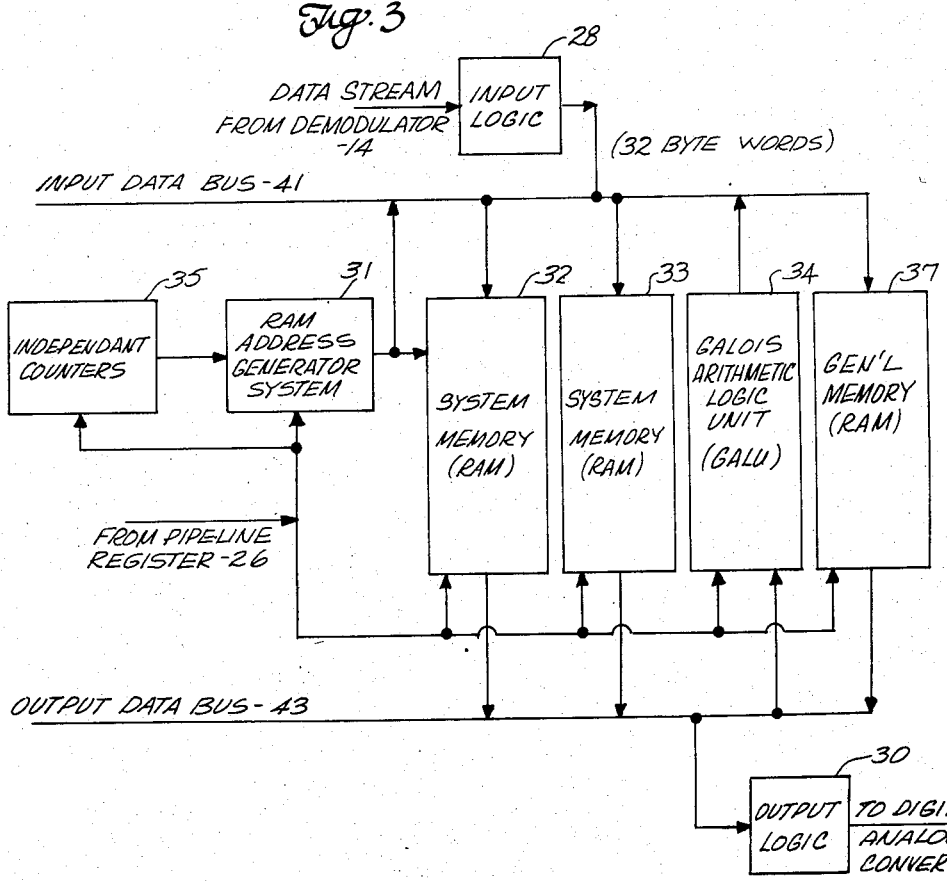

Referring to FIG. 3, input logic 28 receives data from demodulator 14 and serves to combine the input stream from a plurality of channels, as for example, a stereophonic music signal, into a single stream of incoming data bytes as is well known in the art. Input logic 28 also includes buffers (not shown) for temporarily storing incoming data bytes, forming them into a string of thirty-two bytes, and retaining one or more of such strings in a buffer (not shown) until space for such strings becomes available in system memory, preferably composed of random access memory (RAM) 32. Subsequent to decoding and correction, these bytes are reformed into the appropriate channel structure by output logic 30 as is well known in the art.

The system memory is preferably composed of two random access memories or RAMs 32 and 33. RAM 32 is 8 bits wide while RAM 33 is preferably 2 bits in width. Data is stored in RAM 32 from input logic 28 while the erasure flags associated with each data byte are stored in RAM 33. Preferably RAM 32 accommodates a total of 8192 data bytes of digital data while RAM 33 stores the erasure flags associated with each data byte. Preferably the RAMs 32 and 33 are each formed of two 4096 byte semiconductor memories.

Figure 4:
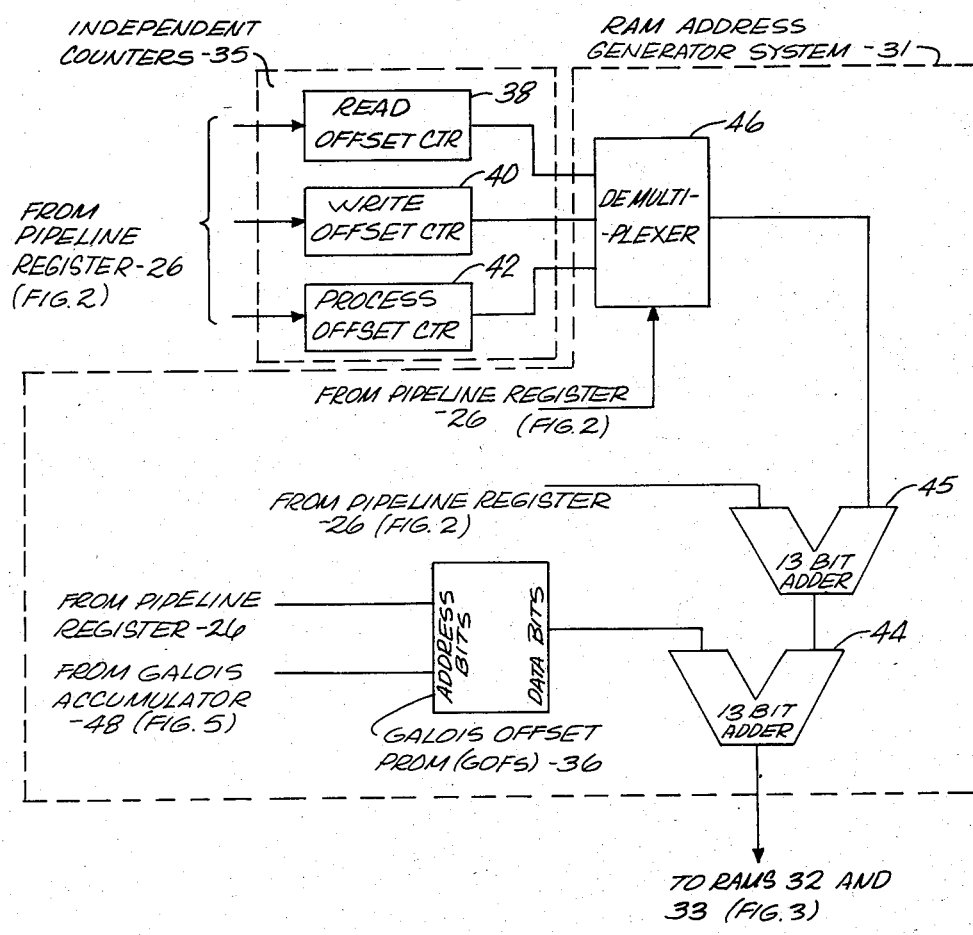
FIG. 4 is a schematic and block diagram showing the independent counters and the RAM address generator system of FIG. 3 used to generate memory addresses.

Means for addressing and determining memory locations in RAMs 32 and 33 at which read, write, or correction operations are to be performed include RAM address generator system 31 and independent counters 35. Referring to FIG. 4, the independent counters 35 are 13 bit counters which include read, write and process offset counters 38, 40 and 42, respectively. In operations involving data correction, a memory location is specified as a Galois number (described below). Before the Galois number can be used to address a particular memory location, however, it is first converted into an actual address of the location of a byte in RAMs 32 and 33. This function is performed by Galois offset (GOFS) programmable read only memory (PROM) 36 (FIG. 4) which is implemented in the preferred embodiment as a lookup table. The address specified by GOFS 36 is summed with the number value stored in the process offset counter 42 by an adder 45 in order to designate the particular address in RAMs 32 and 33 at which a correction operation is to be performed. Any one of counters 38, 40 and 42 may be coupled to adder 45 by demultiplexor 46. Which of the three counters 38, 40 and 42 (FIG. 4) coupled to adder 45 is determined by the control of instructions from pipeline register 26. Counters 38, 40 and 42 are set and controlled as to their counting operations by instructions from pipeline register 26.

In another mode of operation, the system RAMs 32 and 33 address may be specified by an instruction from pipeline register 26. In that case, conversion from a Galois number is not required and an address from one of the instructions in the pipeline register 26 is combined with the current value specified by the appropriate one of counters 38, 40 or 42 by adder 45 to produce the address of the system RAMs to be accessed.

Significantly, this method of determining addresses in system memory permits savings both in the size of the microprogram memory 24 and in the speed with which the various steps involving memory access are executed. This is because the same microprogram instruction can be executed for accessing any memory location, while the actual location of the byte accessed is determined by the counters (38, 40, 42) or by the GOFS 36.

Figure 5:
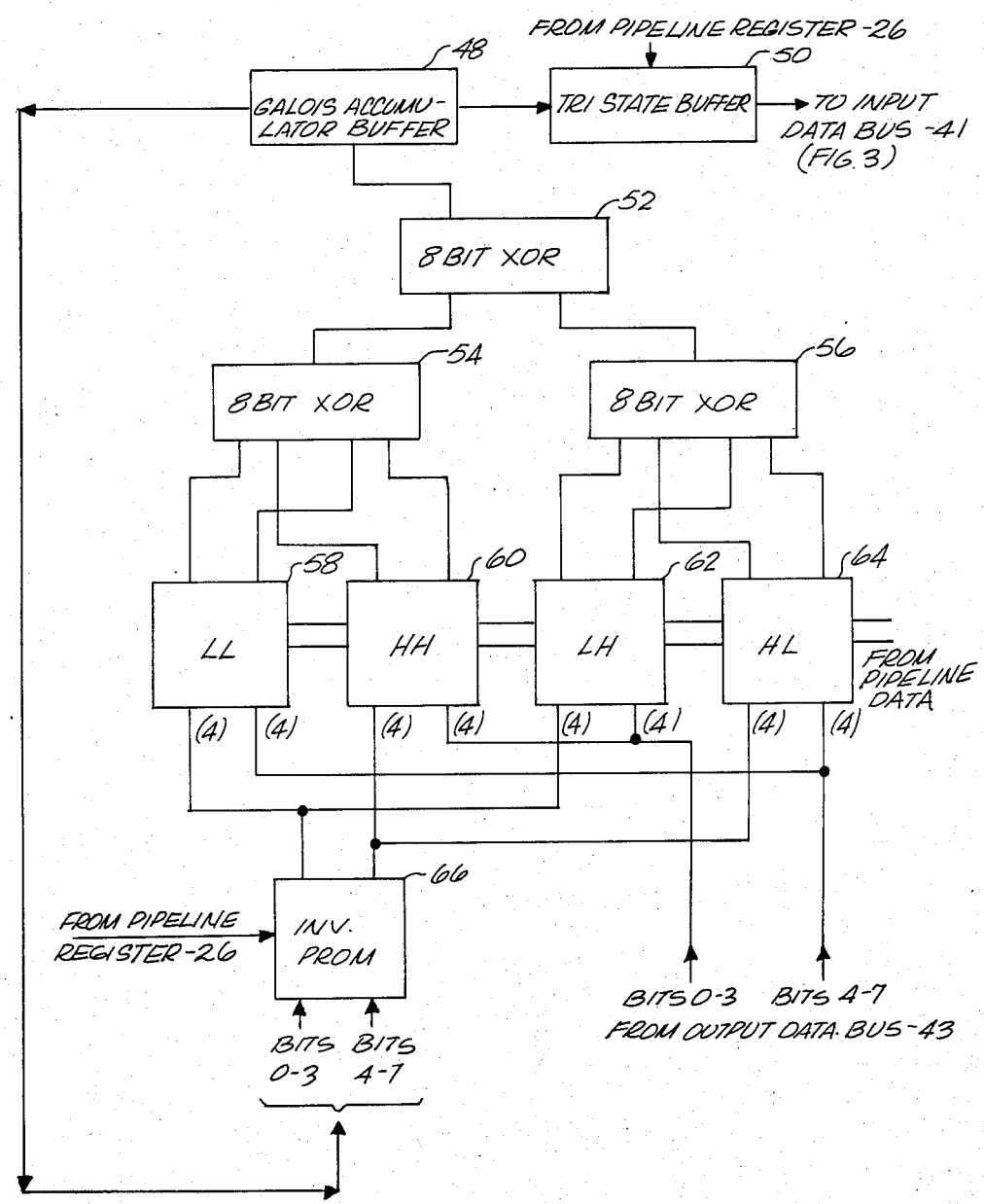
FIG. 5 is a block diagram of the Galois arithmetic logic unit of FIG. 3 used to perform Galois arithmetic.

The organization of the Galois arithmetic logic unit (GALU) 34 is shown in FIG. 5. When Galois arithmetic logic unit (GALU) 34 is performing error correction operations, the addresses of memory system RAMs 32 and 33 are computed by adder 45 using an offset from process counter 42 (FIG. 4). Accordingly, when during error correction operations in which the GOFS 36 is providing an address, the pipeline register 26 input to adder 45 is zero. On the other hand, for read and write operations to RAMs 32 and 33, the output from GOFS 36 is zero in order that the address computed in adder 44 passes through adder 45 unaltered to the RAMs 32 and 33. A control line to GOFS 36 from the pipeline register 26 is provided for the purpose of setting its output to zero for these operations.

Referring to FIG. 5, the GALU 34 includes buffer 48 for temporary storage of data. Memories in the form of PROMs 58-64 are connected to the output of each of XOR gates 52, 54 and 56. To be described in greater detail below, these PROMs are used in the process of performing Galois multiplication.

Read inversion PROM 66 is also included in the GALU. This memory contains values of the root $\alpha$ and its powers (to be explained). The purpose of this memory is to speed multiplication of memory addresses by the appropriate power of $\alpha$.

The operation performed by the GALU in any particular machine cycle is specified by control bytes in the pipeline register 26.

Multiplication in a Galois field is not performed according to the usual rules of arithmetic. This is because all operations in a Galois field must obey a closure requirement. This is easily satisfied for addition using XOR gates 52, 54 and 56. In the case of multiplication, preferably all possible products are noted and prestored in PROMs 58-64. Multiplication is then performed by accessing the appropriate locations of PROMs 58-64 as specified by the pattern of 1's and zeros on the input from output data bus 43 and PROM 66.

Multiplication of two 8 bit numbers requires 16 input lines and $2^{16}$ memory locations. In the preferred embodiment of the present invention an additional technique is used to simplify the task.

Assuming that two 8 bit numbers A and B must be multiplied, each may be represented as the sum of two numbers. For example:

$A = A_H + A_L$ where  Equation (2)

$A_H = a_7\ a_6\ a_5\ a_4\ 0\ 0\ 0\ 0$  Equation (3)

$A_L = 0\ 0\ 0\ 0\ a_3\ a_2\ a_1\ a_0$  Equation (4)

$B_H = b_7\ b_6\ b_5\ b_4\ 0\ 0\ 0\ 0$  Equation (5)

$B_L = 0\ 0\ 0\ 0\ b_3\ b_2\ b_1\ b_0$  Equation (6)

The a's and b's correspond to the values of bits in the eight bit numbers A and B; the other bits are zero. H stands for high and L stands for low value. Note therefore that each number $A_H$, $B_H$, $A_L$, $B_L$ can be represented by a 4 bit number. Galois addition is defined as:

$(A_H + A_L) + (B_H + B_L) =$  Equation (7)

$(A_H + B_H) + (A_L + B_L)$  Equation (8)

Galois multiplication is defined as:

$(A_H + A_L) * (B_H + B_L) =$  Equation (9)

$A_H B_H + B_H A_L + B_L A_H + B_L A_L$.  Equation (10)

This separation of the digits of a number is permissible in Galois operations since operations within a Galois field obey the distributive law. In accordance with the method depicted by Equation 10 above, multiplication of the two numbers A and B is carried out as four multiplications, where two 8 bit numbers are multiplied in each case. As a result of the 4 bit representation of each number, each memory requires only eight input lines and $2^8$ storage locations. Four memories, 58, 60, 62 and 64, are used to store the results of $A_H B_H$, $B_H A_L$, $B_L A_H$ and $B_L A_L$, respectively. It is preferred that each product of the sum shown in Equation 8 is calculated in a separate memory as shown in FIG. 5. Their sum, completing the multiplication, is then calculated in XOR gates 52, 54 and 56. Division is carried out in the same manner as multiplication except that as a preliminary step, the Galois multiplicative inverse of the divisor is determined from a lookup table in inversion PROM 66.

C. System Memory (RAM)

Error detection and correction are effected by processing blocks of digital data bytes with a C1 decoder and C2 decoder. Each decoder, as described further below, is implemented by the components disclosed in the block diagrams of FIGS. 2, 3, 4 and 5 when controlled in accordance with the flow diagram of FIGS. 9–25. In order to maximize the rate at which data is processed, decoders C1 and C2 actually operate concurrently on data stored in system memory 32 with the C1 decoder operating on the data ahead of the C2 decoder.

Figure 6:
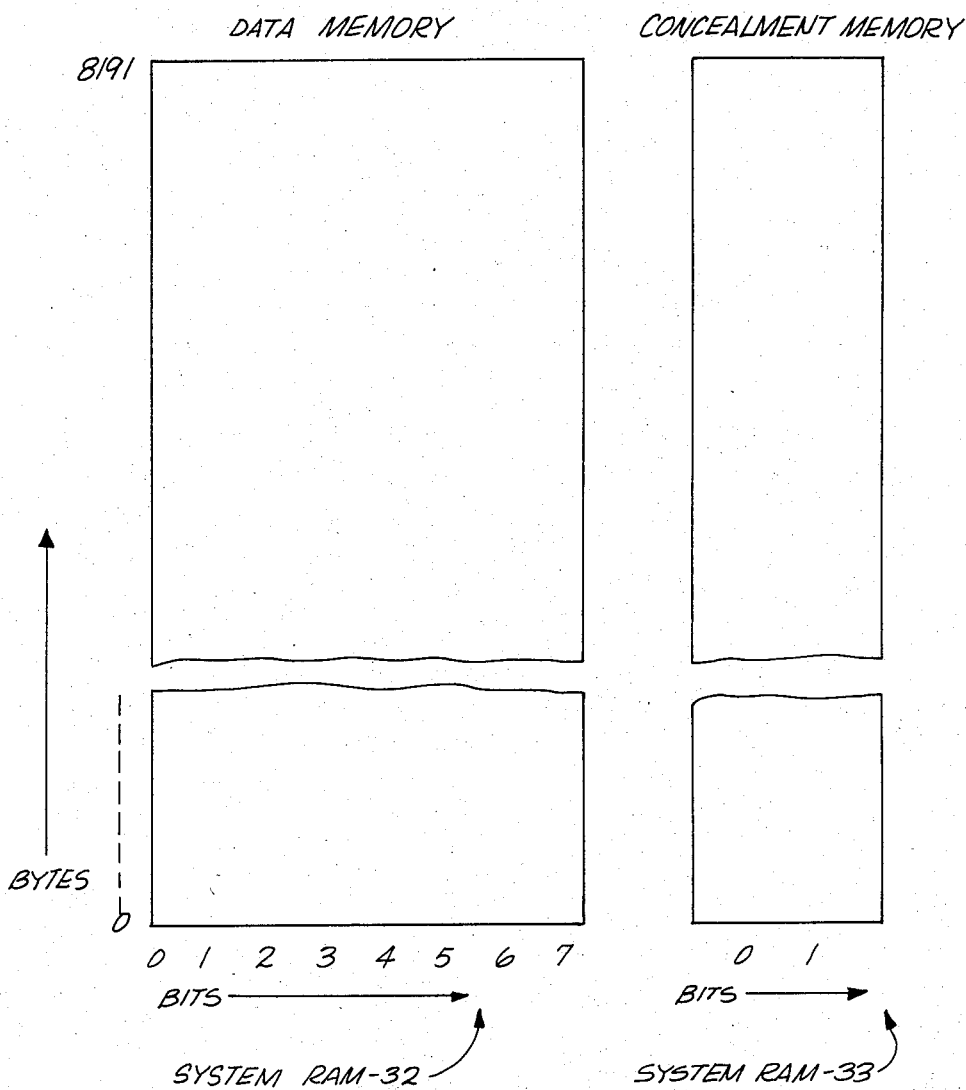
FIG. 6 is an illustrative diagram that depicts the organization of data in system RAM of FIG. 3.
Figure 7:
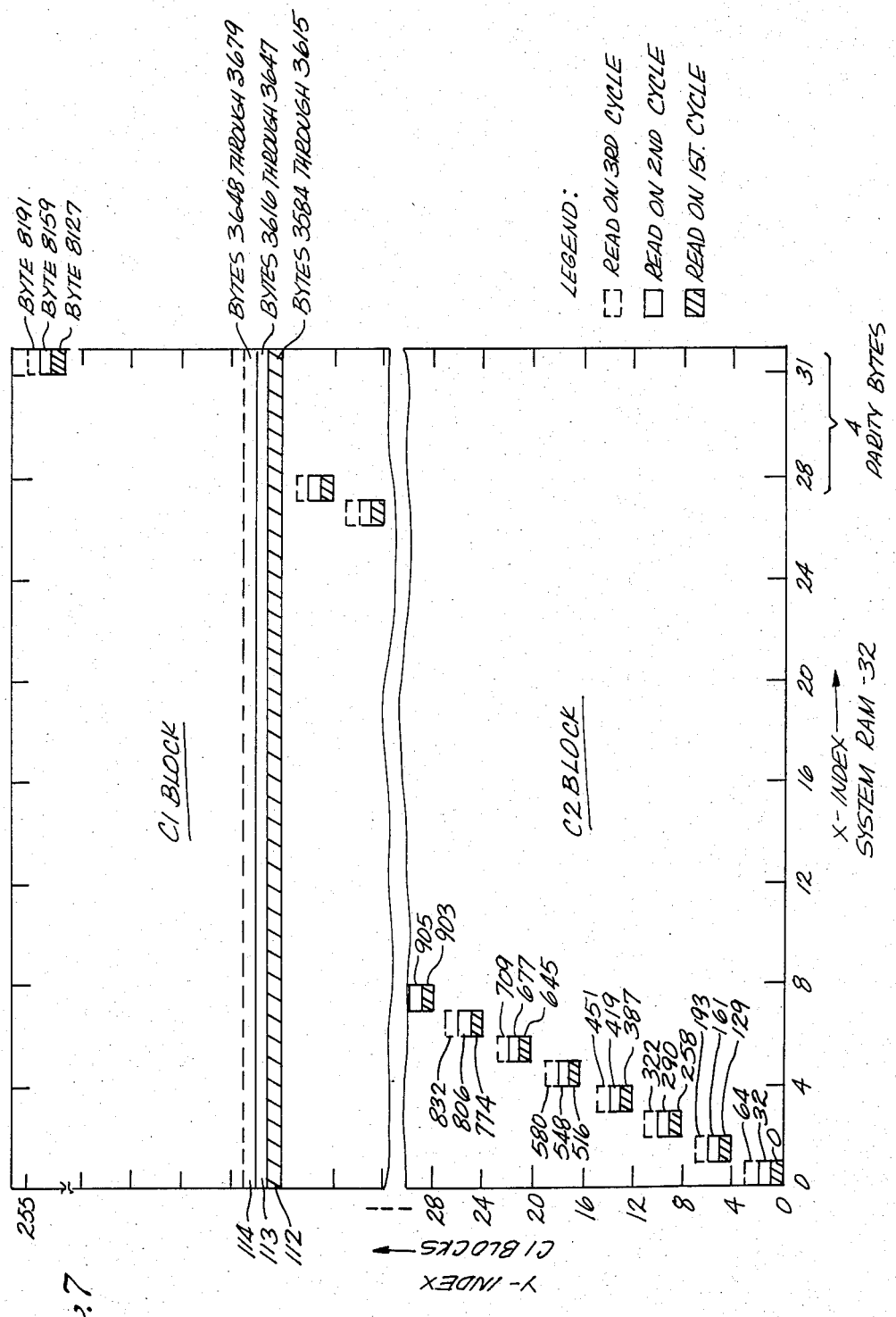
FIG. 7 is an illustrative diagram that depicts the format of the data in system RAM of FIG. 3; data bytes accessed by the first pass of the C1 and C2 decoders on three successive decoder cycles are shown.

In discussing the cooperative operation of the C1 and C2 decoders, reference is made to diagrams of system memory in FIGS. 6 and 7. As previously described, system memory is composed of two RAMs, one RAM 32 for storage of data bytes and a second RAM 33 for storage of erasure flags associated with each data byte.

Although the RAMs are each linear in that information is addressed and read a byte at a time, it is easier to describe the concept of the present invention if the memory bytes are considered as elements of a two dimensioned Cartesian coordinate system as seen in FIG. 7. The vertical or Y axis positions each contain 32 bytes of data. Each horizontal or X axis position represents an 8 bit byte at each Y axis position. The bytes are numbered sequentially within each Y axis position moving from left to right. The leftmost byte of any one Y position is one value higher than the rightmost byte of the next lower Y axis position. For example:

Y position 0 contains bytes 0–31
Y position 1 contains bytes 32–63
Y position 2 contains bytes 64–95
—
—
—

Consider now the sequence with which the bytes of data are read by the C1 and C2 decoders from RAM 32. The C1 decoder reads 32 contiguous bytes, called a "C1 block", at a time. The C2 decoder reads 28 bytes called a "C2 block". Each byte in the C2 block is separated from the others by 128 bytes.

The C1 decoder is initially positioned for reading the C1 block at Y position 112 (e.g., bytes 3584 through 3615). In each succeeding decoder cycle (execution of two passes by both C1 and C2 decoders), the C1 decoder is positioned for and reads the C1 block at the next successively higher valued Y position. Thus on the second cycle the C1 block is positioned at Y position 113 (actually bytes 3616, i.e., 113·32 through 3647). Because of the circular nature of system memory in the preferred embodiment, the sequential advance described will cause bytes 0 through 31 (Y position 0) to be read after bytes 8160 through 8191 (Y position 255).

As shown in FIG. 7, in the Cartesian coordinate system, the bytes comprising a C2 block lie along a diagonal in memory space. The bytes of a C2 block in the first, second and third decoder cycles are shown in Table 1. In successive decoding cycles, the bytes comprising a C2 block are changed. As is true for the C1 block, the increment occurs in steps of 32 bytes. As shown in the Cartesian coordinate system of FIG. 7, this results in a vertical shift of the bytes selected for processing by the C2 decoder.

Table 2 discloses the coordinate positions and the numbers of the bytes accessed by the C2 decoder on first, second and third decoder cycles. The third column or "Byte #" column represents the memory location in RAM as well as the number of the byte in an incoming sequence assuming that the first byte received is numbered zero.

The reason for this pattern of the C2 block will now be described. As previously discussed, the decoding process is largely the reverse of the encoding process. Thus, during encoding, a preferably 24 byte data polynomial is processed by a first encoder, producing four parity bytes. The data is interleaved and then processed by a second encoder, adding another four parity bytes to a data block. Thus the final encoded data block is composed of 32 bytes.

At the encoding stage, interleaving is carried out between first and second encoders. Thus the interleaver handles data blocks which are 28 bytes long. The action of the interleaver is to disperse the bytes of a data block among the stream of data being encoded so that there are 112 bytes (four 28 byte blocks) between successive bytes of the data block being interleaved. After interleaving, four additional parity bytes are added to all 28 byte data blocks by the second encoder. Thus after the encoding is completed, the spacing between successive bytes comprising a C2 block is 128 (112+4·4) bytes.

At the time that the incoming data is loaded into system RAM 32, bytes of a C2 block are separated by 128 bytes. Referring now to FIG. 7, the bytes accessed by the C2 decoder (i.e., the bytes of each C2 block) are also separated by 128 bytes. It can be appreciated then that the present invention accomplishes the step of de-interleaving data by addressing appropriate bytes during one phase of a decoder cycle. As will be discussed in greater detail below, the method of de-interleaving allows multiple decode passes to be made over the same data set since no data bytes are discarded between the C1 and C2 decoder steps.

Consider now the integrated operation of decoders C1 and C2 with system RAM 32. Assume that the entire system is in an initialized condition in which all RAM 32 memory locations have been set to zero in a conventional manner (by means not shown). Assume also that the beginning of an encoded digital data signal is received by input logic 28. Preferably there is provision within the input logic for placing at the beginning of the incoming stream of data bytes, a leader of 3584 bytes, equivalent to 112 C1 blocks, of all zero's. As will presently be explained, the purpose of this "leader" is to insure that all data bytes will be processed by the C1 decoder before being processed by the C2 decoder.

Figure 8:
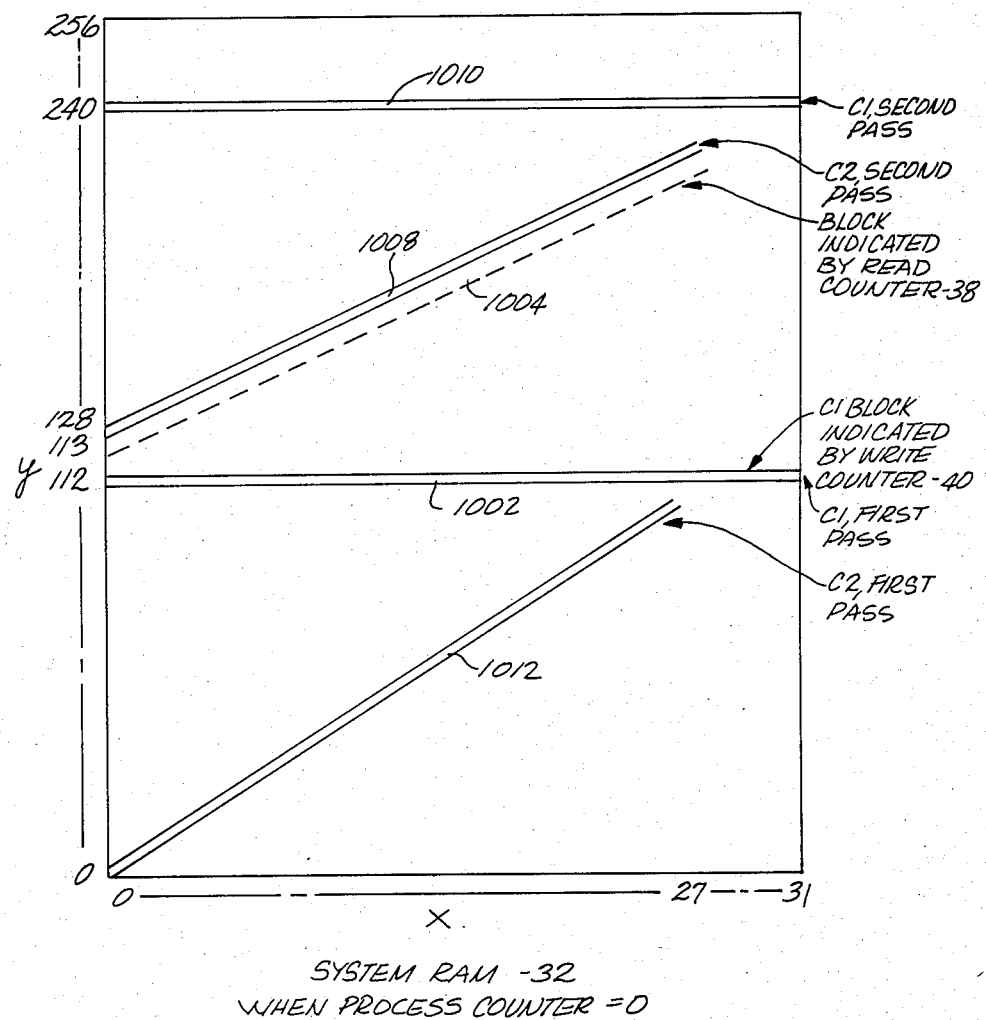
FIG. 8 is an illustrative diagram that depicts locations of the C1 and C2 blocks in system RAM of FIG. 3 which are accessed on the first and second passes; also shown are locations into which data bytes are written and read from system RAM.

When incoming data is first received, read counter 38, write counter 40 and process counter 42 are also set to zero by conventional means (by means not shown). As each of the 112 C1 blocks comprising the leader is written into RAM 32, write counter 40 is incremented by 32. Thus after the leader has been written into RAM 32, write counter 40 is set to 3584 as shown in FIG. 8 via pipeline register 26, while read and process counters 38 and 44 are still at 0. The purpose of the leader is to load all memory locations between byte 0 and the first byte of C1 block 112 with values which, when processed by the C2 decoder, will remain 0. This in turn is to ensure that all data bytes are processed first by the C1 decoder and then by the C2 decoder. It should be understood that other methods of loading RAM 32 or of using counters 38, 40 and 42 will be obvious to those skilled in the art and are within the scope of this invention.

The memory locations accessed by decoders C1 and C2 are specified as offsets relative to the memory locations specified by the process counter 42. Decoder C1 accesses bytes 112 rows ahead of the row indicated by process counter 42. This is effected by providing the value 3584 from the pipeline register 26 to one input of adder 45 while the output of counter 42 is provided to the other input. Thus, for example, if process counter 42 indicates bytes corresponding to row 0 in FIG. 7, the C1 decoder would access bytes corresponding to row 112 of FIG. 7 as illustrated at 1002 of FIG. 8. The first C2 byte would be in the row pointed to by the process counter 42, whereas the rows of other bytes in a C2 block would be specified as appropriate offsets from the current value of process counter 42. For example, the bytes of a C2 block for process counter 42 at state 0 are along line 1012 of FIG. 8. Formulas for computing offsets for all members of C2 blocks are provided in Table 1-A.

The two-pass feature of the present invention is implemented, in the presently preferred embodiment, by a second pass through the C1 decoder and a second pass through the C2 decoder after the first pass through the C2 decoder. This in turn is effected by positioning the second passes through the C1 and C2 decoders 4096 bytes (128 C1 blocks), at addresses in RAM 32, ahead of the offsets used for the first pass through the C1 and C2 decoders.

Referring now to FIG. 8, it can be seen that with the process counter 42 set to 0, the offset for the second C1 decoder is coordinate 240 as depicted at 1010 and for the second C2 decoder at coordinate 128 as depicted at 1008. Write counter 40 is set to byte 3584 so that data is added to RAM 32 at coordinate 112 (see 1002) just ahead of the first pass through the C1 decoder as indicated at 1002, while read counter 38 is set at byte 3648 so as to read out data blocks along 1004 just behind (i.e., immediately after processing by) the second pass of the C2 decoder. The details of this sequence of execution of these steps are described in greater detail below.

It should be noted that when data is added to RAM 32, it is added as a contiguous sequence of 32 bytes, i.e., a C1 block. When data is read out of memory into output logic 30 after both passes through the C1 and C2 decoders, it is removed from RAM 32 in the form of a C2 block, except that the 8 parity bytes at X locations 24 through 31 are ignored. Recalling the earlier discussion of the process of de-interleaving, it should be clear that the removal of corrected data in this pattern will cause the sequence of data bytes present before encoding to be recreated.

A "decoder cycle" is defined herein as the complete execution of two passes by decoders C1 and C2. Upon completion of a "decoder cycle", process counter 42 is incremented by 32, moving the reading frame of the first and second decoders C1 and C2 to higher numbered rows.

In the preferred embodiment, data is loaded from logic 28 into C1 blocks (i.e., Y coordinate rows) just ahead of the current reading block of the C1 decoder. To this end, write counter 40 is incremented by 32 after execution of each decoder cycle. As successive rows of bytes are added to memory 32, read counter 38 is also incremented, maintaining read counter 38 behind the bytes processed during the second pass through the C2 decoder.

D. Overall Operation of the Preferred Embodiment
Introduction

Figure 9:
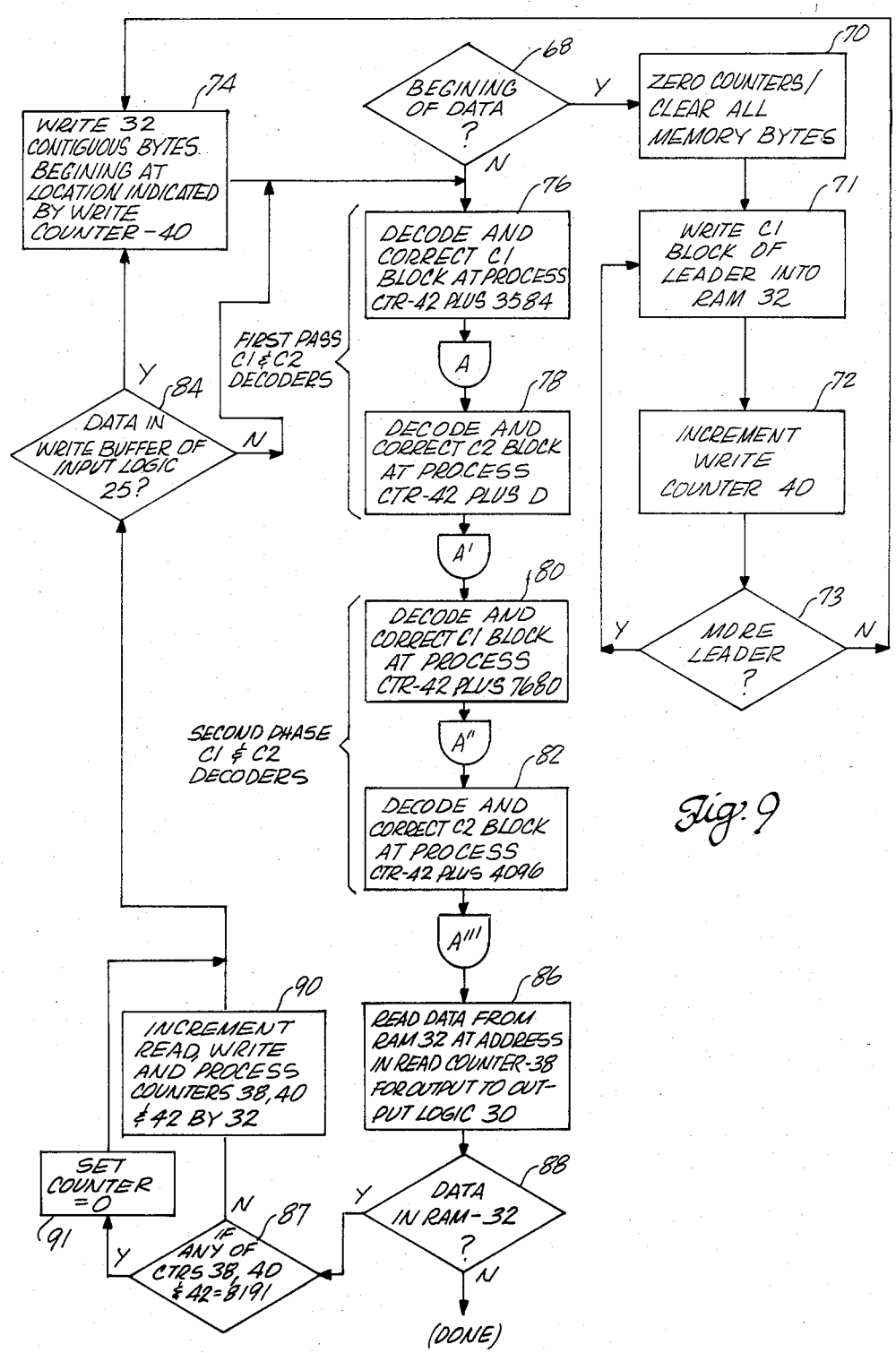
FIG. 9 is a simplified flow diagram of the operation of the system of FIGS. 1-8 depicting the overall method used for error detection and correction.

Consider now the detailed operation of the system including the computer program and the hardware, depicted by the flow diagram of FIG. 9. Assume that the beginning of encoded digital data signals have reached input logic 28 at test block 68 of the flow shown in FIG. 9. The system determines that the incoming data bytes represent the beginning of a new sequence of data, as for example the beginning of a digital musical recording. To this end input logic 28 (using conventional means not shown) detects the 3584 byte "leader" segment in which all bits are zero and causes the system to enter block 70.

At block 70, read, write and process counters 38, 40 and 42 are set to 0. Also at block 70 all RAM 32 memory bytes are cleared. The 3584 byte leader is written into RAM 32 at block 71 of the flow as 112 contiguous C1 blocks. In other words, the first 3584 bytes of RAM 32 are filled with this leader. As each C1 block (32 bytes) of leader is written into RAM 32, write counter 40 is incremented by 32 at block 72 of the flow. Blocks 71, 72 and 73 are repeated for each C1 block of leader data. During each entry to block 73 a test is made in that the input logic 28 determines whether the leader segment has ended. Thereafter the entry logic causes the system to go to block 74. Write counter 40 is now at 3584.

During block 74 the first C1 block of digital data is written into RAM 32 at Y position 112 (FIG. 7) (i.e., at bytes 3584 through 3615).

At block 76 of the flow of FIG. 9, the first C1 decoder processes the 32 data bytes (forming the first C1 block) in the RAM 32 memory location corresponding to Y position 112 (FIG. 7) and corrects errors in those data bytes. The value 3584 representing Y position 112 is the sum of the value in process counter 42 (i.e., 0) and the offset value of 3584 from the pipeline register 26 which is computed by adder 45. The method of the C1 decoder will subsequently be described in detail.

At block 78 of the flow the first C2 decoder processes a block of 28 bytes and corrects errors in the data bytes. The method of the C2 decoder will also be subsequently described.

Initially the locations accessed by the C2 decoder have been loaded with leader bytes at block 71 of the flow. After processing by the C2 decoder these locations will remain zero. However, following a C1 and C2 decoder cycle, a C1 block of data is written as described above. After a sufficient number of decoder cycles, sufficient C1 blocks of encoded digital data will have been stored into RAM 32 to fill it up. As a result the C2 decoder will then be processing real encoded digital data.

At block 80, the offset value 7680 from pipeline register 26 and the value 0 in process counter 42 are added by adder 45 to form value 7680. As a result the bytes 7680 to 7711 in RAM 32 corresponding to a Y index of 240 (FIG. 7) are processed by the C2 decoder during block 80.

At block 82, a second pass is made through the C2 decoder at an offset of 4096 plus the value 0 stored in process counter 42. As described above, the offset value 4096 is provided by the pipeline register 26, and adder 45 adds this value to the value in the counter 42.

At block 86, 24 bytes of data are read from RAM 32 to output logic 30. The locations of these bytes are determined as the sum of offsets from pipeline register 26 and the value stored in read counter 38.

Read 38, write 40 and process 42 counters are incremented at blocks 87, 90 and 91 of the flow, which is entered after block 88.

When sufficient data is available in the buffer in input logic 28 to allow another C1 block to be written into RAM 32, at test block 84 the program flow branches to block 74 at which point the block is written into RAM 32 at the Y position indicated by the current value of write counter 40.

Defining a decoder cycle as the operation during flow blocks 74, 76, 78, 80, 82, 86, 88, 87, 91, 90 and 84, the decoder cycles are reexecuted, incrementing counters 38, 40 and 42 until all incoming data has been stored, processed and read by output logic 30. Blocks 76 and 78 for the first C1 and C2 decoders represent the first decoder pass while blocks 80 and 82 for the C1 and C2 decoders represent the second pass.

In summary, the consequence of incrementing process counter 42 is to cause the reading frame for the decoders to advance in 32 byte steps through RAM 32. This is shown diagrammatically in FIGS. 7 and 8 as well as in Tables 1, 1-A and 2. Because read counter 38 and write counter 40 are also incremented at block 90 of the flow, incoming data blocks are added just ahead of the first C1 decoder at each decode cycle, while corrected data is removed immediately following processing by the second pass through the C2 decoder.

The removal of data is effected each time block 86 is entered, as follows. The value in read counter 38 is combined with a series of offset values from the pipeline register 26 by adder 45 to form the addresses of locations at which a C2 block of data bytes is to be read. The address values are read out of RAM 32 and transferred to output logic 30.

Decoder

Assume now that the system RAM 32 has been loaded as required at blocks 68 through 74 (FIG. 9). Refer to the flow diagram of FIG. 10. After test block 92, since the current C1 pass is a first pass, block 95 is entered where an offset register C1OFST, residing in the microsequencer 22, is set to 3584; on the second pass, block 94 is entered where C1OFST is set to 7680. As described above, rows 112 and 240 are the Y coordinate rows (FIGS. 7 and 8) for the first C1 block for the first and second passes, respectively, of the C1 decoder.

After block 94 or block 95, blocks 96 through 106 are entered where the decoding and correction operations actually take place on the encoded digital data stored in RAM 32.

As a first step in the decoding operation, four syndromes, $S_0$ through $S_3$, each a representation of the number of errors in a C1 block, the location of those errors and the nature of those errors, are calculated at block 96. The method by which each syndrome is calculated is disclosed in the flow diagram of FIG. 16.

The locations of data bytes within a C1 block accessed during a decoding operation are specified by combining, in adder 45, successive instructions from pipeline register 26 and the value in the process counter 42. For the C1 decoder, 32 addresses must be designated. Each address is calculated as a byte number. For example, the general form of an addresss for the C1 decoder is $$PC + C1OFST + K \qquad \text{Equation (11)}$$

where PC is the value stored in process counter 42 and K takes on values of 0 to 31 for each of the 32 bytes of the current C1 block. The microsequencer 22, microprogram memory 24 and pipeline register 26 provide a value $C1OFST+K$ for each different byte of a C1 block. Each subsequent byte K is incremented in the microsequencer by 1 until the addresses of all bytes of a C1 block have been determined and read. The addition of the term PC to the term $C1OFST + K$ takes place in the adder 45. By way of example, for the first byte of this block the address is $PC + 3584$.

For the second byte, the address is $PC + 3585$ where the values 3584 and 3585 are from the pipeline register, and so on.

Figure 16:
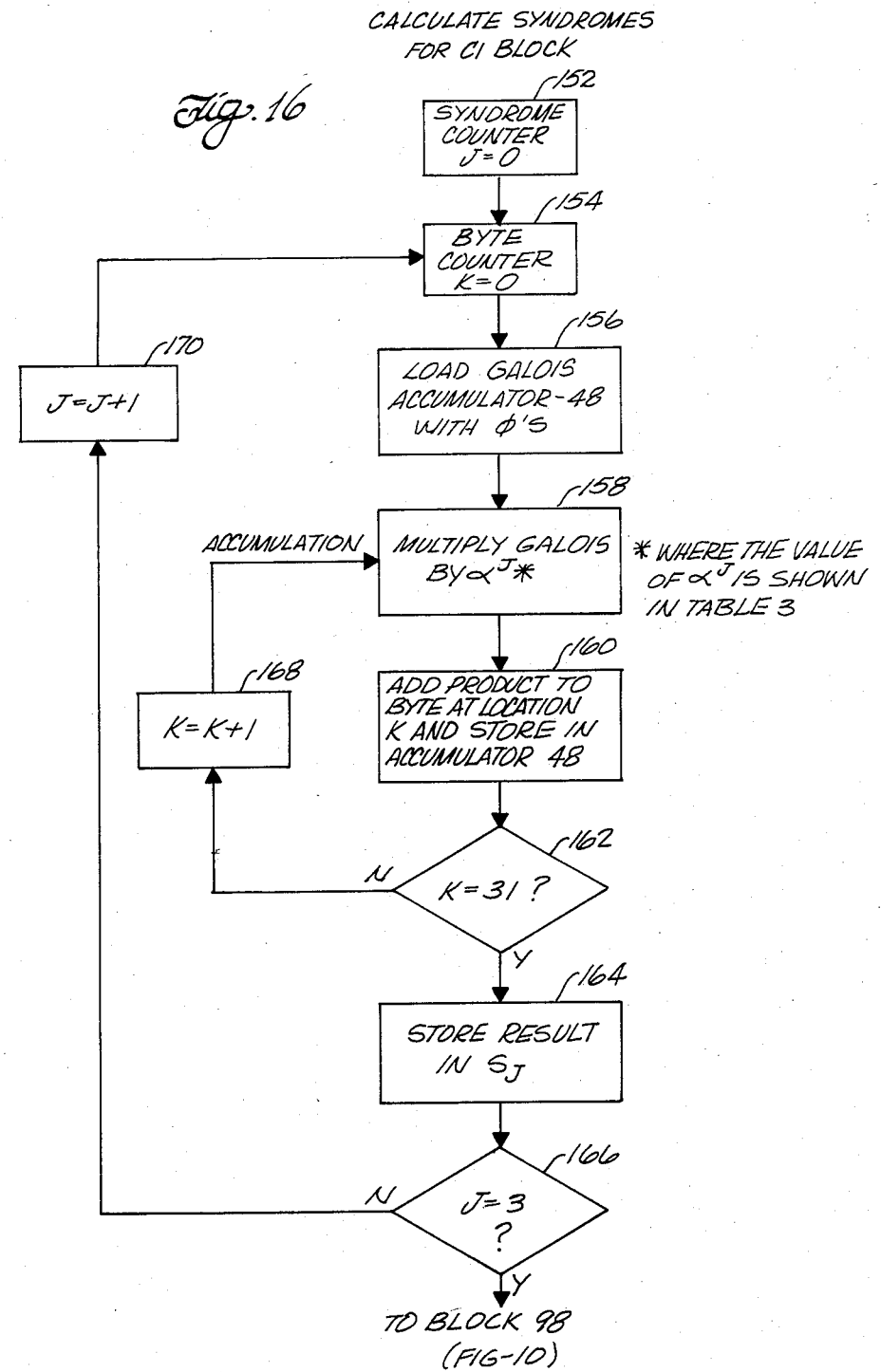

Consider now how the syndromes are formed during block 96 as indicated in more detail in FIG. 16. A partial sum is formed of the contents of Galois accumulator 48 and the Galois product of the data byte at an address within the current C1 block and a power of $\alpha$. In the preferred embodiment, the primitive polynomial is $$X^8 + X^4 + X^3 + X^2 + 1.$$

As previously explained, $\alpha$ is a primitive root of this polynomial. The relationship between $\alpha$ and octal numbers is fully disclosed in Tables 3 and 4. Other primitive polynomials of degree 8 may be employed. See by way of example, those disclosed in *Error Correcting Codes* by Peterson and Weldon, published by MIT Press in 1972, Appendix C, which is incorporated by reference herein. To this end, syndrome counter J and byte counter K, located in the microsequencer 22 and microprogram memory 24 (FIG. 2) are set to 0 at blocks 152 and 154 of the flow. The Galois accumulator 48 (FIG. 5) is set to 0 at block 156. The Galois product of the contents of the Galois accumulator 48 and the value $\alpha^J$ is formed at block 158. It should be understood that the power J signifies that this is the Galois product of $\alpha$ multiplied by itself J times.

The values of $\alpha$, its powers, the products of these values and the Galois addresses at all bytes in a block are stored in a lookup table in a programmable read only memory (PROM) called the inversion PROM 66 (FIG. 5). This implementation is used in order to speed computation. The value which is selected from the table in inversion PROM 66 is determined by the value in the J and K counters provided in an instruction from the microsequencer 22 program memory 24 and the pipeline register 26. The values of the J and K counters from the pipeline register 26 are then applied to the inversion PROM 66 for selecting the appropriate value.

The result from inversion PROM 66 is added to data from memory location K at block 160 in PROMs 52 through 56. Assuming the last byte of the C1 block has not been reached, block 168 is entered after block 162 and during block 168 the value of byte counter K is incremented by 1. The process of forming Galois products and forming a partial sum in the Galois accumulator 48 at blocks 158, 160 and 162 of the flow is repeated for each byte in the current C1 block, that is, until the value of byte counter K becomes equal to 31, indicating that a complete syndrome $S_0$ has been formed. When this occurs, block 164 is entered after block 162 where the value of the syndrome $S_0$ in accumulator 48 is stored in a buffer $S_0$ (not shown) located in general memory RAM 37 (FIG. 3) at block 162 of the flow. Syndrome counter J is now incremented by microsequencer 22 by 1 at block 170. Blocks 156–170 of the flow of FIG. 16 are reentered and a second syndrome $S_1$ is calculated according to the method outlined above, using the bytes of the same C1 block but with the J counter equal to 1. Similarly, syndromes $S_2$ and $S_3$ are also computed using the above described method and stored in a memory at block 164 but with the J counter equal to 2 and 3, respectively. When the four syndromes have been calculated at test block 166, the J counter will be at 3, causing the program to return to the main flow of FIG. 10 at test block 98.

Significantly, this method for calculating syndromes is exceedingly rapid. Each term of the partial sum formed at block 160 of the program flow of FIG. 16 is calculated in the preferred embodiment in a single machine or clock cycle. By way of comparison, the method for calculating syndromes described in the prior art requires division of a polynomial composed of each term of the C1 data block and its address by a polynomial comprising terms of $\alpha$.

The syndromes are utilized in determining the location of errors and for correcting errors once their location has been determined.

Figure 10:
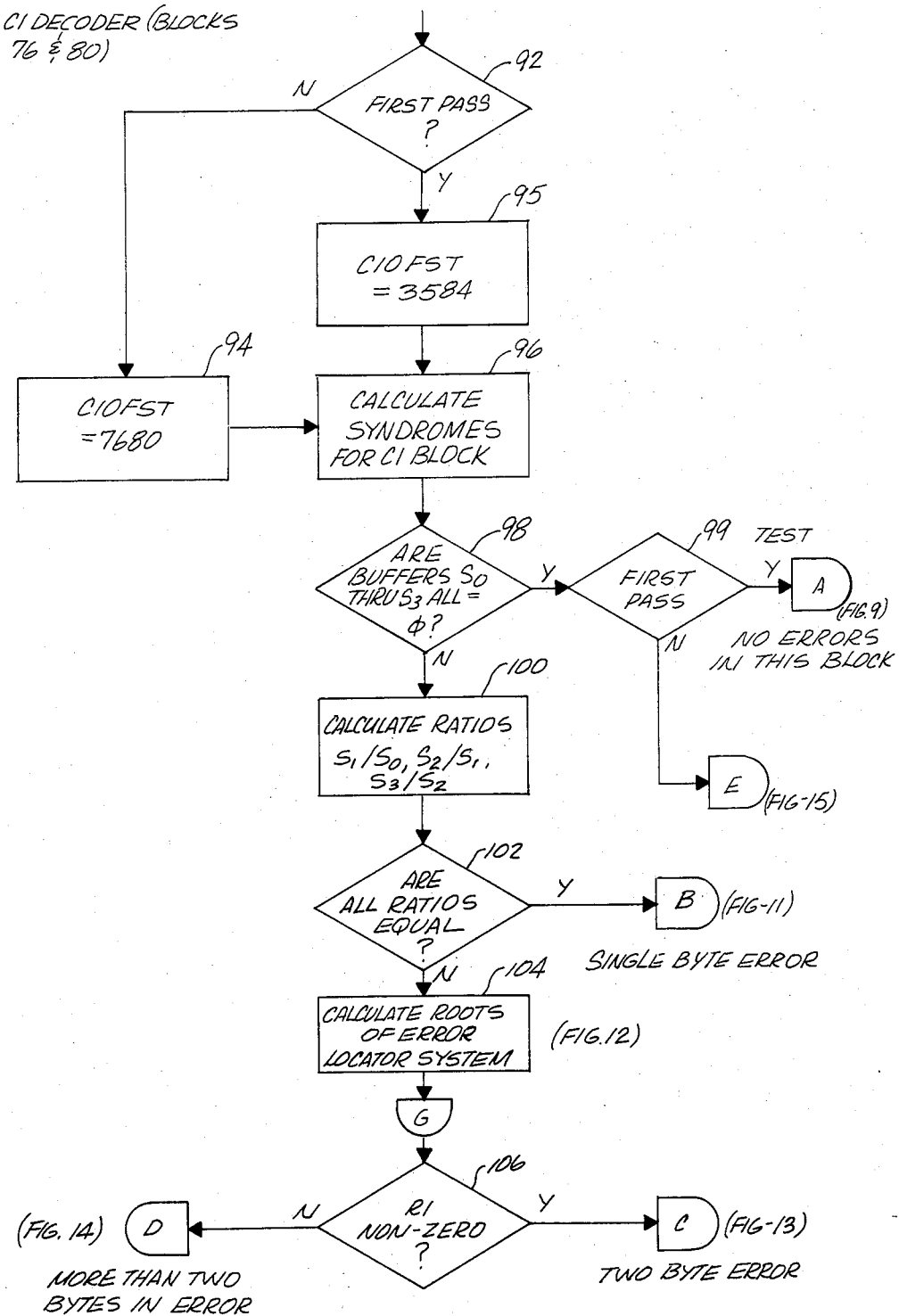
FIGS. 10 to 23 form a detailed flow diagram of the operation of the system of FIGS. 1-8 depicting the details of the method according to one embodiment of the invention.

At block 98 of the flow of FIG. 10, syndromes $S_0$ through $S_3$ are tested to determine whether they are equal to 0. This can be done in a number of ways known in the art such as examining the content of buffers $S_0$–$S_3$ or looking for non-0 digits as the information is stored in the buffers. If so, there are no errors in the present C1 block of data, test block 99 (FIG. 10) is entered. If at test block 99 it is found that this is a first pass through the C1 decoder, the program returns to the main flow of FIG. 9 via bullet A to block 78 of FIG.

9 where the first C2 decoder pass or operation takes place. If on the other hand this is a second pass of the C1 decoder, program flow branches from block 97 via bullet E to the flow of FIG. 15. At block 150 of FIG. 15, any erasure flags (described further below) set for bytes in the current C1 block are cleared. Program flow then continues by way of bullet A″ with the second C2 decoder at block 82 of the flow shown in FIG. 9.

If the values of the four syndromes are not all zero during block 98, further processing is required in order to locate and correct errors and therefore block 100 is entered.

At block 100 of the flow of FIG. 10, the ratios $S_1/S_0$, $S_2/S_1$, and $S_3/S_2$ are computed using PROMs 58 through 66 and the syndromes $S_0$ through $S_3$ in RAM 37. If the values of these three ratios are all equal when tested at block 102 of the flow, it is likely that one error is present in the current C1 data block. Program flow then continues via bullet B to a routine shown in FIG. 11 to be described in greater detail below, which locates and corrects the error. If at test block 102 the ratios are not all equal, then an equation termed the error locator equation (described in detail connection with in FIG. 12) is solved at block 104 to determine whether two or more than two errors are present in the current C1 block.

Figure 12:
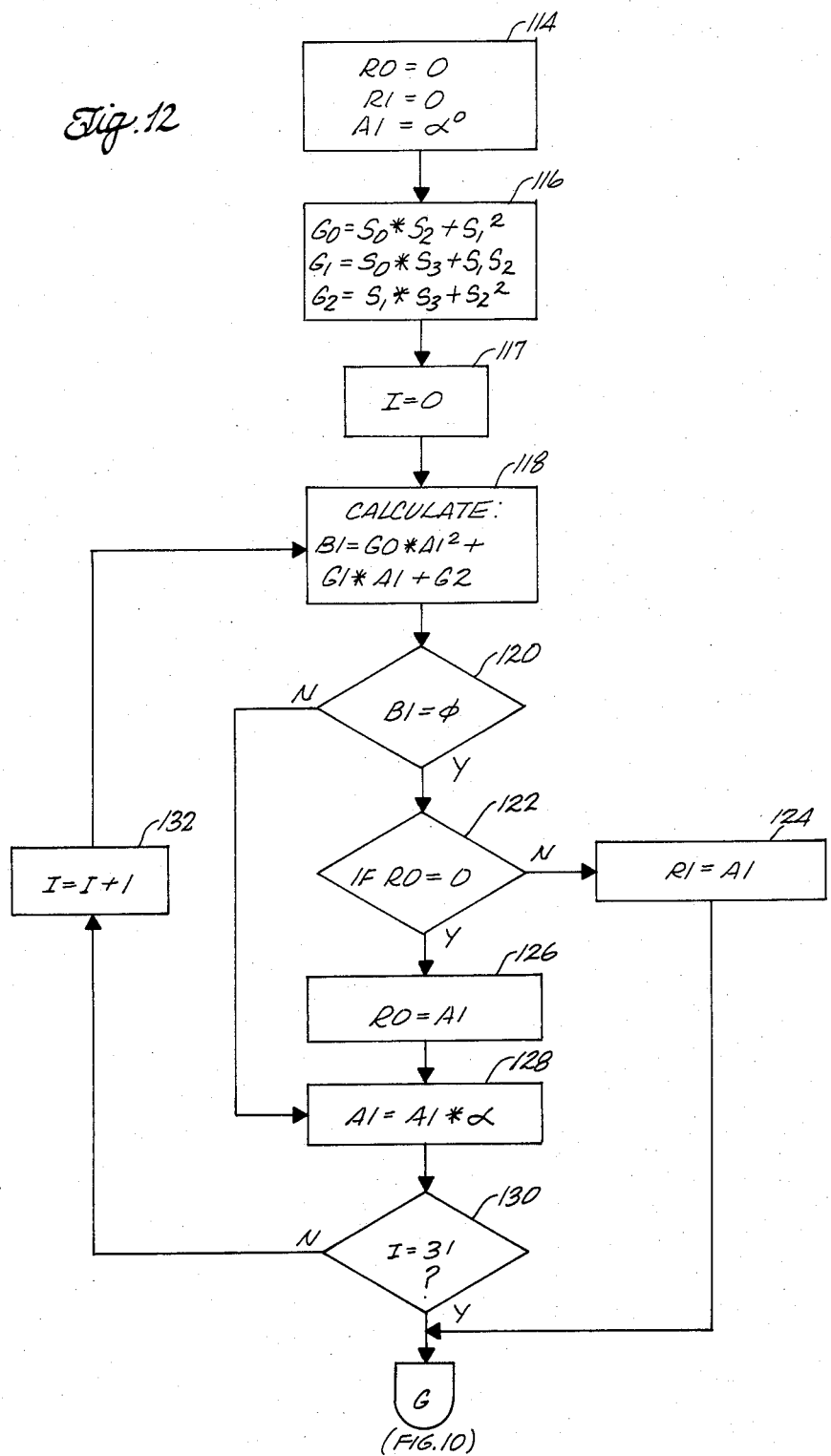

Refer now to FIG. 12 which discloses a method for obtaining the roots of the error locator equation (Equation 12). These roots correspond to the locations of errors in the current C1 data block and are formed in register R0 and R1 in RAM 37 during the flow of FIG. 12.

$$B1 = (S_0 {}^* S_2 S_1{}^2) {}^* A1^2 + (S_0 {}^* S_3 + S_1 {}^* S_2) {}^* A1 + (S_1 {}^* S_3 + S_2{}^2) \quad \text{Equation (12)}$$

At block 114 of the flow, the values in buffers $R_0$ and $R_1$ in RAM 37 are set to zero and register A1 in RAM 37 is set equal to the value $\alpha^0$ from inversion PROM 66. The value $\alpha^0$ is read from PROM 66 under control of an instruction from microsequencer 22 and pipe register 26. Next, at block 116, values of the coefficients $G_0$, $G_1$ and $G_2$ shown in Equations 13, 14 and 15 are calculated from the syndromes contained in RAM 37 using PROMs 58-64, XOR's 54-56 and ALU 52 (FIG. 5).

$$G0 = S_0 {}^* S_2 + S_1{}^2 \quad \text{Equation (13)}$$

$$G1 = S_0 {}^* S_0 {}^* S_3 + S_1 + S_2 \quad \text{Equation (14)}$$

$$G2 = S_1 {}^* S_1 {}^* S_3 + S_2{}^2 \quad \text{Equation (15)}$$

The values of G0, G1 and G2 are then stored into RAM 37. Loop counter I is then set to zero at block 117. At block 118, the value of B1 shown in equation 16 is calculated using the GALU 34.

$$B1 = G0 {}^* A1^2 + G1 {}^* A1 + G2 \quad \text{Equation (16)}$$

The value of B1 is then tested at block 120. If it is equal to 0, then the content of register R0 is tested at block 122. If register R0 is equal to 0, then at block 126 R0 is set equal to A1 and block 128 is entered. A1 is re-calculated during block 128 as the product of the current value of A1 and α by the GALU 34.

Assuming loop counter I in the microsequencer 22 and microprogram memory 24 is not yet at value 31 during block 130, then block 132 is entered where counter I is incremented by 1 and block 118 is reentered. If at block 122, R0 is found to be not equal to 0, block 124 is entered where R1 is set equal to A1 (both in RAM 37) and program flow returns to block 106 of FIG. 10 through bullet G.

Figure 11:
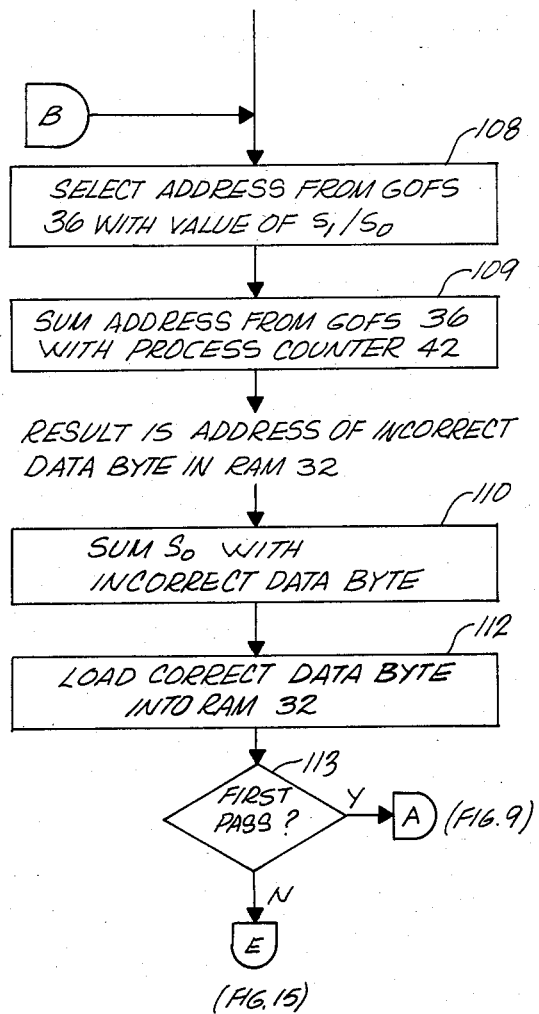

If at block 120 of FIG. 11, B1 is not equal to zero, the program proceeds to block 128 where A1 is updated as previously described. At block 130, counter I is tested. If counter I is equal to 31, the program returns to block 106 of FIG. 10 through bullet G. Otherwise, counter I is incremented at block 130 and block 118 is reentered.

Thus up to 32 different values of A1 are substituted into either of equations 12 or 16, in order to determine which values will cause B1 to assume a value of zero. The values substituted for A1 are powers of α(i.e., $\alpha^0$ to $\alpha^{31}$). The values of A1 which cause B1 to be equal to 0 are Galois representations of the locations of errors in the current C1 data block. Once these are found, program flow returns to the main flow of FIG. 10 via bullet G. If less than two 0 values of B1 result after 32 tries, then R1 is 0 and more than two errors are present in the current data block and program flow returns to FIG. 10 via bullet G.

Returning now to the flow shown in FIG. 10, the value in the R1 register of RAM 37 is tested at block 106. If R1 is equal to 0, more than two errors are present in the current C1 block. In that case, program execution passes via bullet D to block 149 of the flow of FIG. 14. On the other hand, both of registers R0 and R1 will have values that are equal to values of between $\alpha^0$ and $\alpha^{31}$, these values are representations of the locations of errors in the current C1 block and bullet C is followed to block 134 of FIG. 13.

Refer now to FIGS. 10 and 11 and consider the method of error correction for single errors. Assuming that at block 102 of the flow, all syndrome ratios have been found to be equal, program execution continues via bullet B to block 108 of the flow shown in FIG. 11. The value of the ratio $S_1/S_0$ is a representation of the location of the error in the current C1 block. At block 108 the value of the syndrome ratio $S_1/S_0$ is used to select an address from GOFS 36. If desired, one of the other two ratios S2/S1 or S3/S2 could be used to select an address in GOFS 36 since all are equal. The address from GOFS is summed with the current value of the process counter 42 in adders 45 and 44 in order to generate the address of the erroneous byte in the system RAM 32 at block 109 of the flow. The data byte in this location is added to the value of $S_0$ located in RAM 37 by XOR gates 52, 54 and 56 at block 110. The result, which is the correct value of the data byte, is then restored in system RAM 32 at the address from which the erroneous data byte was read during block 112.

After block 112, test block 113 is entered. If the current pass of the C1 decoder is the first pass, a branch is taken via bullet A to block 78 of FIG. 9. If the current pass is the second pass of the C1 decoder, a branch is taken via bullet E to block 150 of FIG. 15 where, as previously described, any erasure flags in RAM 33 corresponding to the current C1 data block are returned to 0.

A similar procedure is followed if two errors are detected at block 106 of the flow in FIG. 10. Program flow passes by way of bullet C to block 134 in FIG. 13. Since registers R0 and R1 in RAM 37 contain the locations of the erroneous data bytes in Galois form, it is possible to use these values together with those of $S_0$ and $S_1$ in RAM 37 to correct the errors. Any two syndromes may be used in place of $S_0$ and $S_1$ for error correction.

Figure 13:
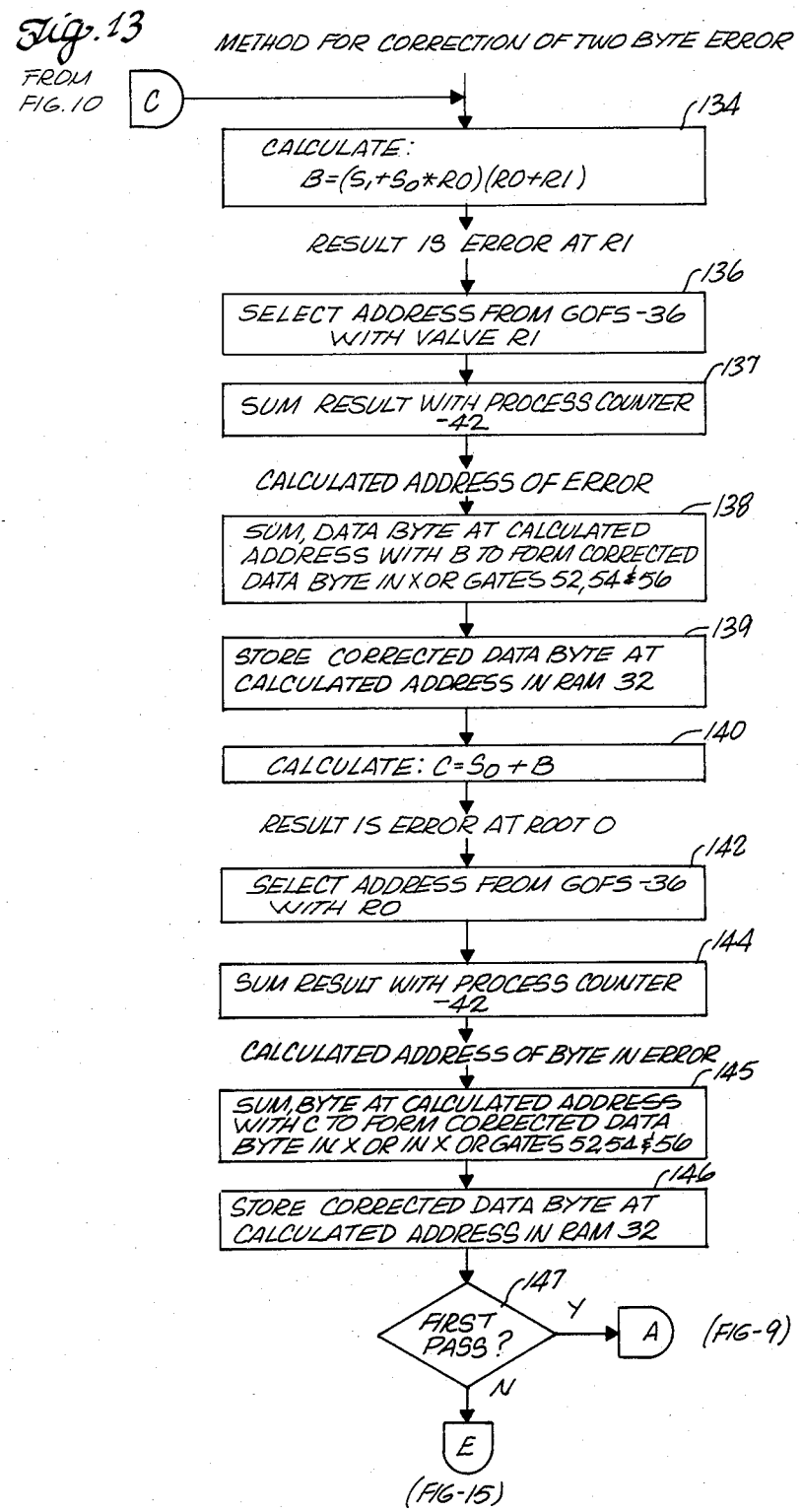

Referring now to FIG. 13, the value B, the error at location R1, is calculated at block 134 of the flow using the following equation:

$$B = \frac{(S_1 + S_0 * R0)}{R0 + R1} \qquad \text{Equation (17)}$$

where the values $S_1$, $S_0$, R0 and R1 are in RAM 37. It should be understood that all operations described are performed according to the rules of a Galois field.

At block 136 (FIG. 13) R1, the Galois representation of the location of a first error in the current C1 block, is used to select an address from GOFS 36 (FIG. 4) and the selected address is summed in adders 45 and 44 with the current value of the process counter 42 to obtain the location of a first incorrect data byte in system RAM 32 at block 137. The value B is then added to the data byte located at this address using XOR gates 52, 54 and 56 at block 138. The result is the corrected byte which is then deposited in system RAM 32 at the address of the incorrect data byte at block 139.

The error present in a second incorrect data byte is calculated at block 140 of the flow. The value of this error is:

$$C = S_0 + B \qquad \text{Equation (18)}$$

where $S_0$ is in RAM 37 and B is the value calculated in block 134. This sum is computed in XOR gates 52, 54 and 56 (FIG. 5). At block 142, the register R0, the Galois representation of the address of a second incorrect data byte, is used to select an address from GOFS 36 at block 142. The result is combined with the current value of the process counter 42 in adders 45 and 44 at block 144. The result of this operation is the location in system RAM 32 of a second incorrect data byte. The byte at this location is added in XOR gates 52, 54 and 56 to the value of C at block 145. The result, the corrected data byte, is then stored in system RAM 32 at the location of the incorrect data at block 146. If at test block 147 this is the first pass by a C1 decoder, program flow continues by way of bullet A to block 78 of FIG. 9. Otherwise, the flow passes via bullet E to block 148 of FIG. 15.

Figure 14:
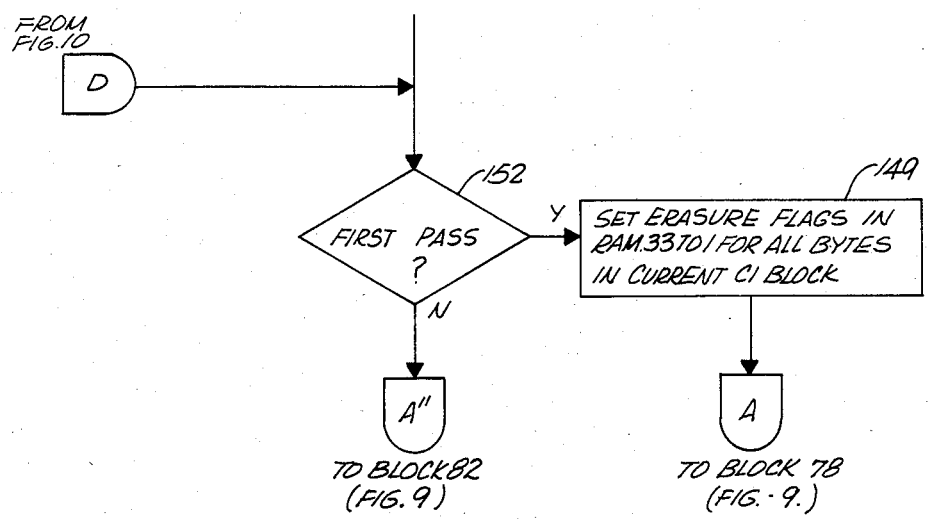
Figure 15:
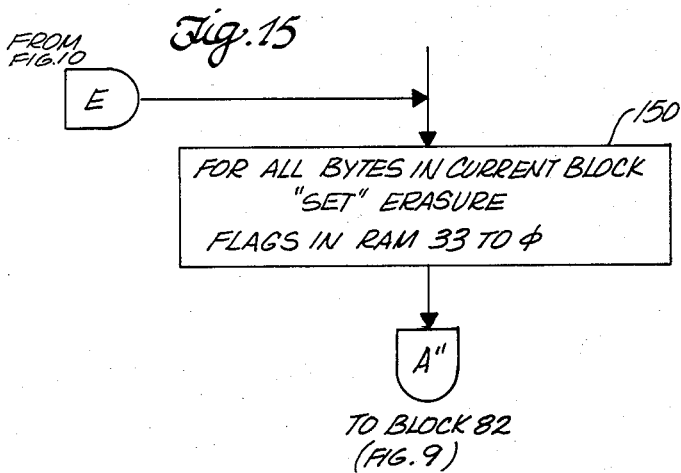

Returning to FIG. 10, in the event that at test block 106 a result is obtained which indicates the occurrence of more than two errors, program flow proceeds via bullet D to block 152 of the flow shown in FIG. 14.

If at test block 152 of the flow of FIG. 14 the present C1 pass is the first pass through the C1 decoder, program flow continues via block 149 and bullet A to block 78 of the flow shown in FIG. 9. Block 78 is the first pass through the C2 decoder. If at test block 152 the present C1 pass is the second pass through the C1 decoder, program flow returns via bullet A″ to block 82 of the flow of FIG. 9. Block 82 is the second pass through the C2 decoder. Returning to block 149, as prevìsouly mentioned, only up to errors may be specifically corrected by the methods disclosed up to this point. If more than two errors are present, then at block 149 of the flow all erasure flags in RAM 149 for the current C1 block are set equal to 1. The erasure flags are in single bits of storage in RAM 33; RAM 33 has a bit of storage corresponding to each of the data bytes of storage in RAM 32. Setting erasure flags indicates the presence of possibly incorrect data bytes. As is well known in the art, erasure flag data may be used to conceal uncorrectable error patterns in a data block by interpolation of surrounding data blocks. Alternatively, 3 or 4 errors may be specifically corrected using known methods (not described herein).

C2 Decoder

Having completed the steps for the detection and correction of errors in a C1 block, program flow continues to block 78 of the flow of FIG. 9. At this point the first C2 decoder processes data bytes specified by the sum of the value stored in process counter 42 and the offsets incorporated into the instructions for the decoder. The addresses, or locations, of the bytes processed during the current pass of the current C2 decoder are determined as the sum of offsets stored in microprogram memory 24 and process counter 42. Offsets for the first, second and third decoder cycles are disclosed in Table 2. A general formula for addresses during all cycles for the second pass of the C2 decoder is given in Table 1-A.

For example, the general formula for the addresses of bytes in the C2 block, first pass is $$\text{P.C.} + 129 \cdot K \qquad \text{Equation (19)}$$

where P.C. is the value stored in the process counter 42 and K takes on values of from 0 to 27, one such value for each of the 28 bytes of the current C2 block. For each byte in the block a value (or offset) representing the product of K and 129 (i.e., zero to 3483) is formed in pipeline register 26 under control of microprogram memory 24 and microsequencer 22. This offset is summed with the value in process counter 42 in adder 45. As a result each byte in a C2 block is displaced by 129 bytes from the adjacent byte or bytes in the same C2 block.

The method whereby the C2 decoder detects and corrects data bytes is largely similar to that utilized by the C1 decoder. The C2 decoder, as already mentioned, processes a different sequence of data bytes than does the C1 decoder. It also processes 28 bytes instead of 32 bytes as in the C1 decoder. As is true for the C1 decoder, in the steps executed by the decoders to detect and correct errors, no distinction is made between information and parity bytes; all are simply considered data bytes. As also mentioned previously, all data bytes processed by the C2 decoder have been previously processed by the corresponding C1 decoder. To be described in more detail below, advantage is taken of this fact by utilizing the error flags associated with each data byte and stored in the RAM 33.

Since the method used in the C2 decoder (FIGS. 17-23) is similar to the method employed in the C1 decoder (FIGS. 10-16), those blocks which are essentially the same are designated by reference numerals which are the same as those used for the corresponding blocks but incremented by 100. The corresponding FIGS. are as follows:

| C1 Decoder | C2 Decoder |
| --- | --- |
| 10 | 17 |
| 11 | 18 |
| 12 | 19 |
| 13 | 20 |
| 14 | 21 |
| 15 | 22 |
| 16 | 23 |

Figure 17:
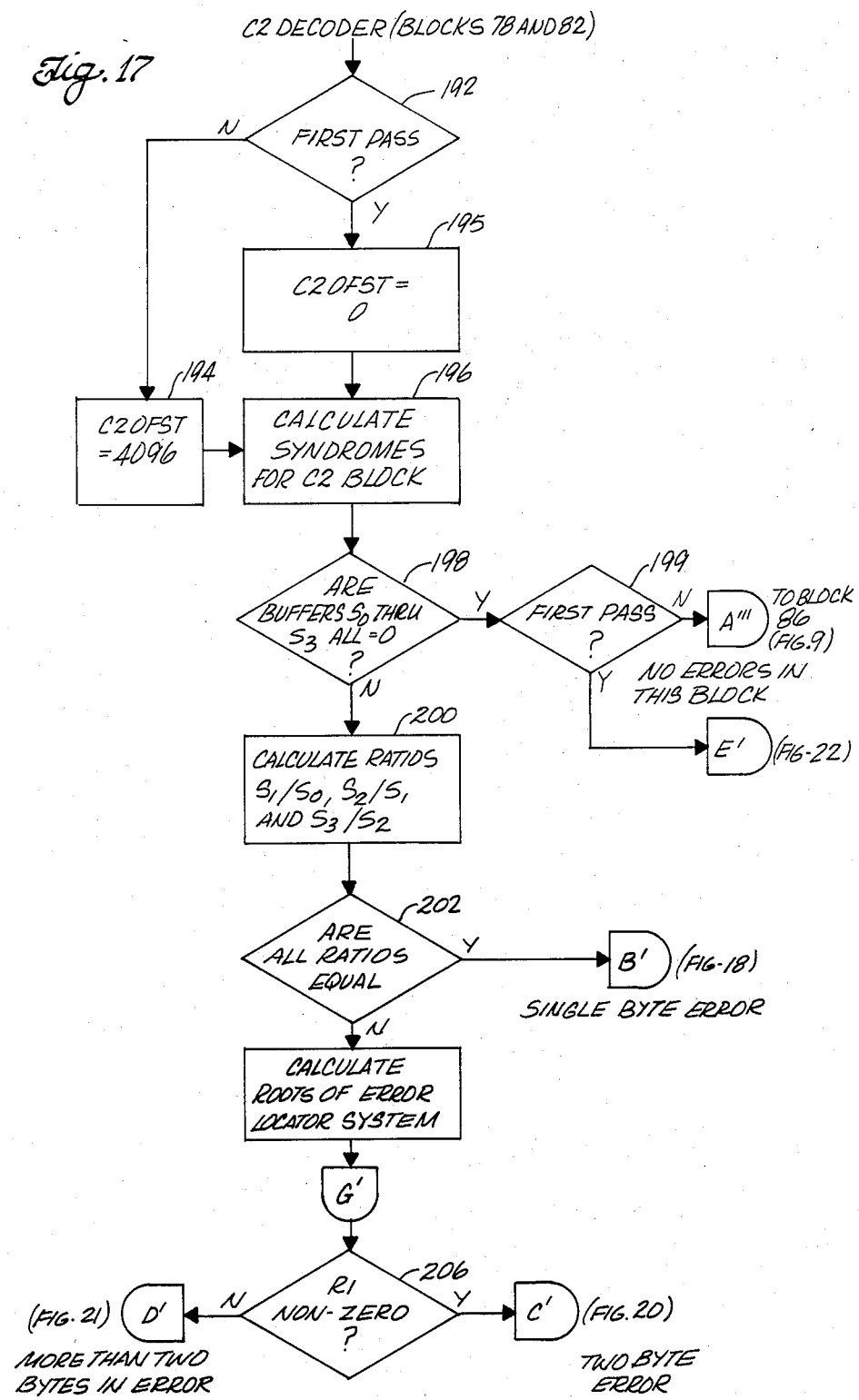
Figure 18:
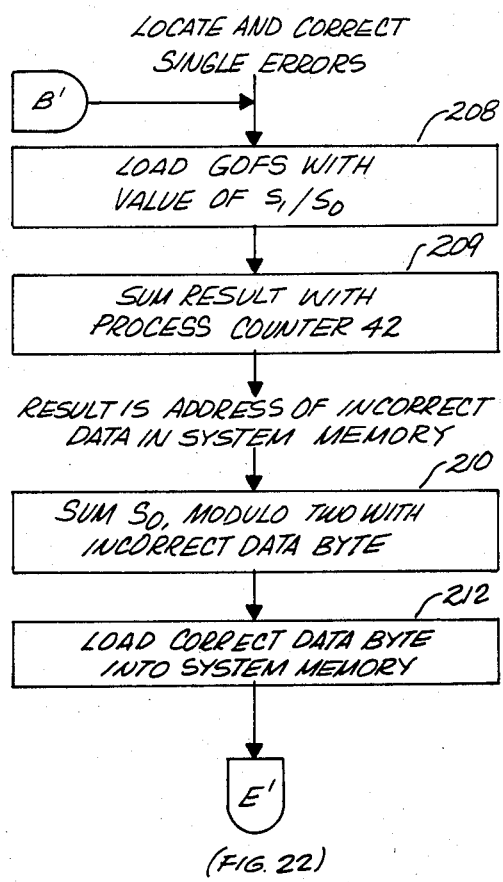
Figure 19:
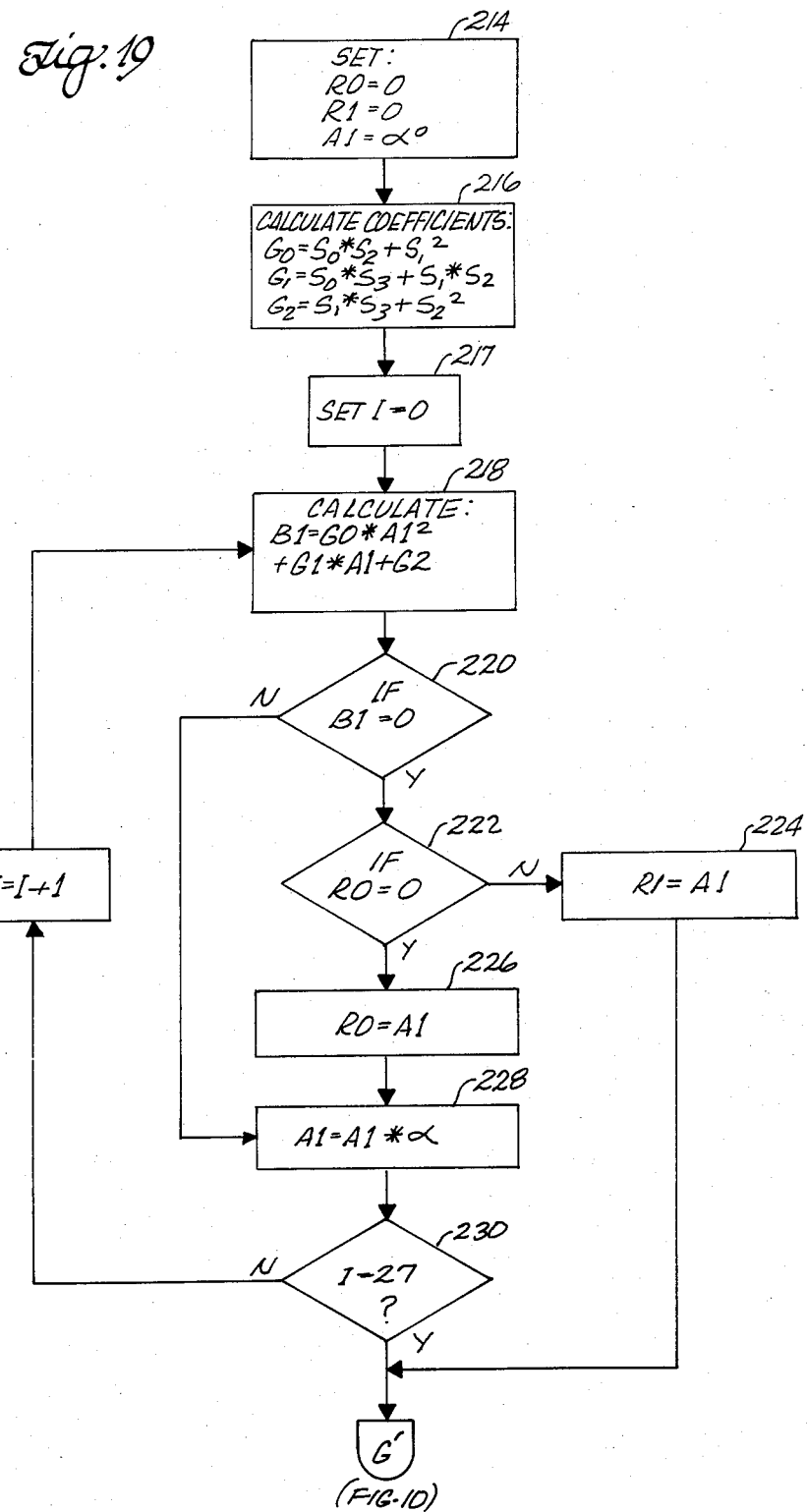

For example, block 106 in FIG. 10 is block 206 in FIG. 17. This convention is used for convenience so that flow blocks whose operations are essentially the same need not be redescribed. Those blocks which are numbered differently or those block using the above number convention which differ significantly will be described.

Also various registers, variables and counters such as $S_0$, $S_1$, $S_2$, $S_3$, R0, R1, K, J, etc., have the same names in the C2 decoder as in the C1 decoder. It will be understood that these are separate from and acquire different values from those used during the C1 decoder flow. An exception to this is the actual data in RAM 32 and associated erasure flags which are common for both decoder flows.

The steps executed by the C2 decoder in order to detect and correct errors in a C2 block are similar to those described for the C1 decoder in FIG. 10. As a first step, at block 196 of the flow of FIG. 17, four syndromes $S_0$ through $S_3$ are calculated using the method outlined in the flow diagram of FIG. 22. This method is essentially the same as that disclosed in connection with FIG. 16 pertaining to the C1 decoder except that the addresses of successive bytes in a C2 block computed in block 258 during the first pass of the C2 decoder are specified by equation 2 of Table 1-A rather than the byte counter K alone in block 158 of the C1 decoder shown in FIG. 16. The reason for this is that locations of successive bytes of a C2 block are one interleave distance apart rather than directly adjacent as in a C1 block. Another difference is that a C2 block contains only 28 bytes rather than 32 as in a C1 decoder. Therefore when K exceeds 27 during block 264 (FIG. 23), the branch is taken back through block 268 to increment the J counter and then to block 254. Likewise in the case of FIG. 19 at test block 230 when counter I is 27, an exit is taken from block 230 back to block 206 through bullet G' of FIG. 10 because all positions in the block have been processed.

Figure 21:
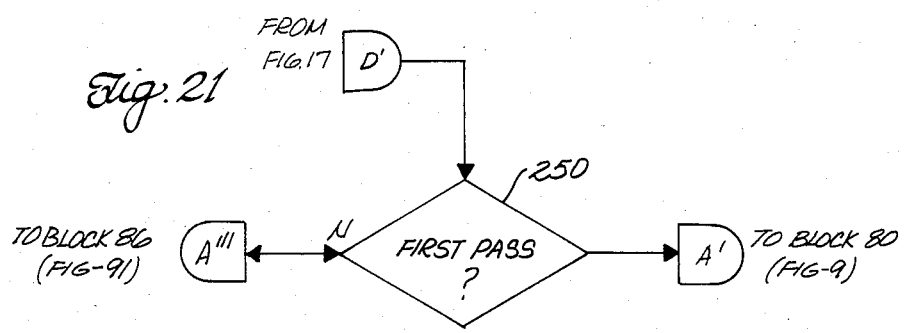

If more than two errors are detected at test block 206 (FIG. 17) then the program branches by way of bullet D' to test block 250 of the flow, FIG. 21. If at test block 250 this is a first pass through the C1 and C2 decoders, program flow continues with block 80 (the second pass through the C1 decoder) of FIG. 9, via bullet A'. If on the other hand this is a second pass through the C1 decoder, program flow continues via bullet A''' with execution of block 86 of FIG. 9.

At block 192 (FIG. 17), if this is a first pass by a C2 decoder, register C2OFST in RAM 37 is set to 0. At block 195, while if a second pass, it is set to 4096 at block 194. The value of C2OFST is used in a manner similar to that previously described for C1OFST in determining the location of data bytes in the C2 data block.

Figure 20:
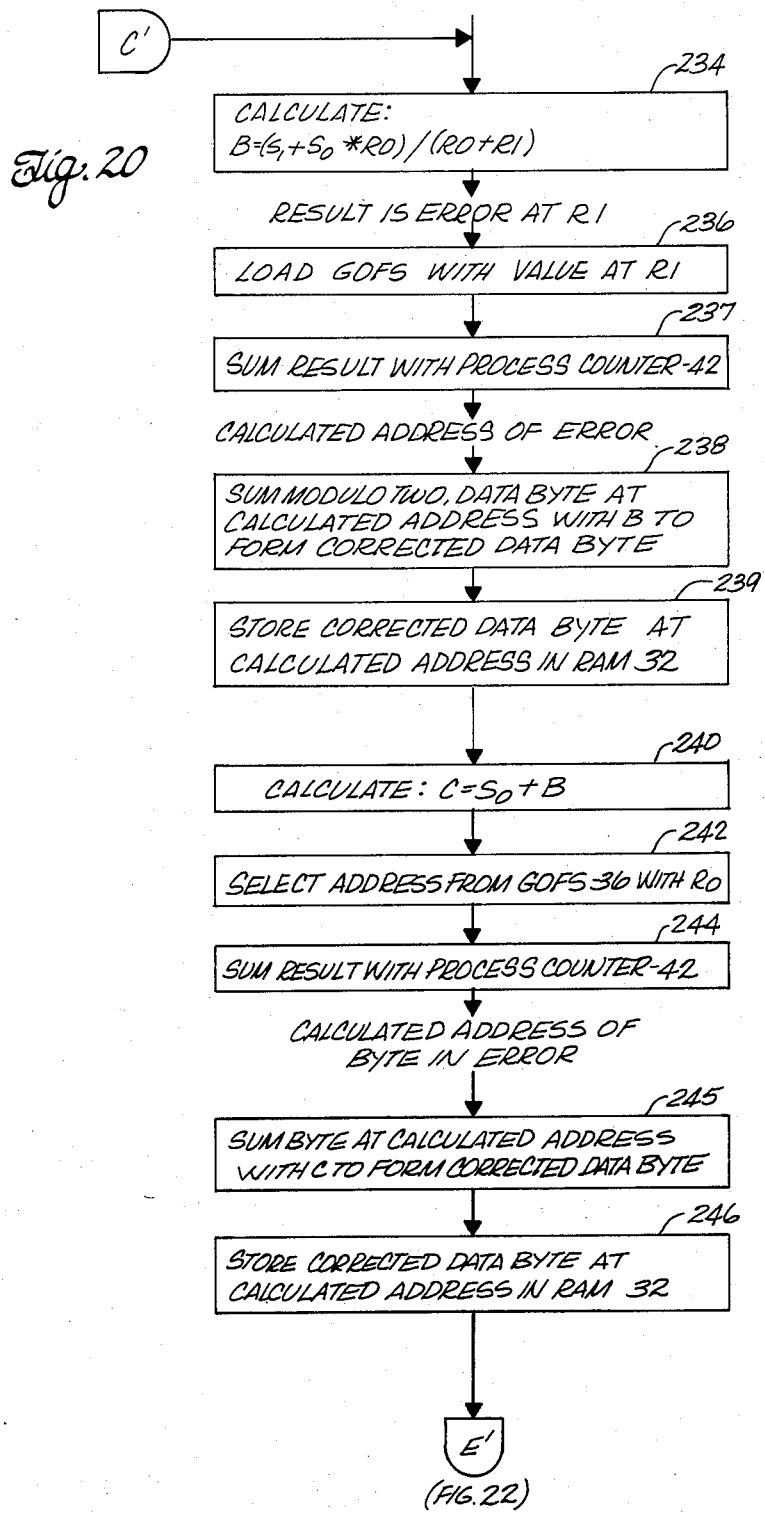
Figure 22:
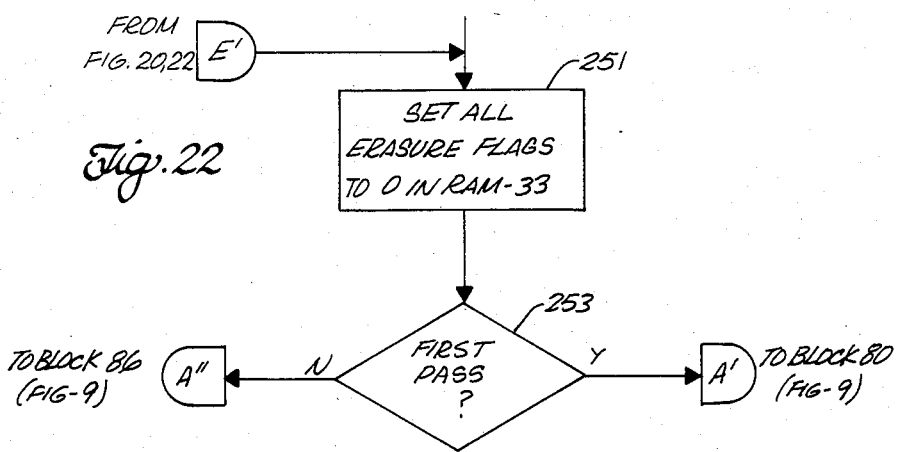
Figure 23:
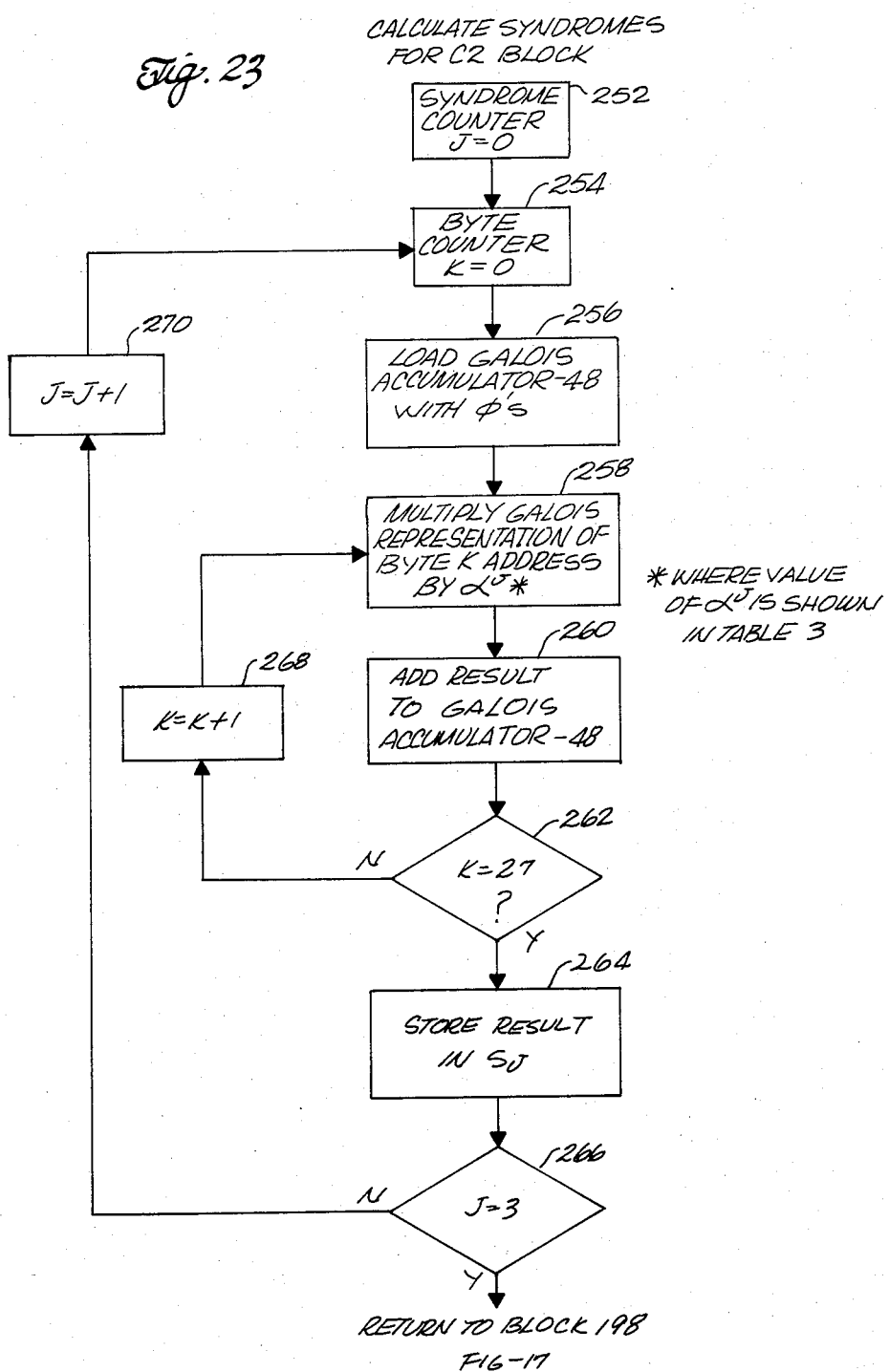

Following the two error correction routine presented in FIG. 20, program flow passes via bullet E' to block 251 of FIG. 22. At this point all erasure flags in RAM 33 are cleared. Then test block 253 is entered. If at test block 253 this is a first pass, program flow passes to block 80 of FIG. 9 via bullet A' where a second pass of the C1 decoder is executed. If on the other hand the present C2 pass is a second pass, program flow continues via bullet A''' to test block 86 in FIG. 9. Since the second C2 decoder is the final sequence of a decoder cycle (i.e., two passes through both the C1 and C2 decoders), the next steps executed during block 86 involve moving data out of RAM 32 to output logic 30 and incrementing independent counters 38, 40 and 42 (FIG. 4).

At block 86 of the flow of FIG. 9, data bytes from RAM 32 are transferred or read out into output logic 30. The locations of the data bytes read out are determined by a series of offsets included in the instruction formed by microsequencer 22, microprogram memory 24, and pipeline register 26, and the value currently stored in read counter 38 (depicted by dashed line 1004 of FIG. 8). Data bytes are read out from RAM 32 in the pattern of a C2 data block. Thus, offsets similar to those disclosed in Table 1-A in conjunction with the discussion of the second pass of the C2 decoder are used. Since the bytes must be read *after* processing by the second pass of the C2 decoder (indicated at 1004 of FIG. 8), the offset for each byte is just 32 bytes less than that used for the second pass of the C2 decoder. Equation 4 from Table 1-A gives a general expression for the bytes accessed by the second pass of the C2 decoder. Subtracting 32 from the offset for each byte in equation 4 gives the general equation of the addresses for readout to the output logic:

$$RC + 4064 + 129 \cdot K \qquad \text{Equation (20)}$$

where the value stored in read counter 39 (RC) has been used instead of process counter 42.

At test block 88 (FIG. 9), if unprocessed data is still present in RAM 32, program flow continues through block 84 (to be described). Otherwise, all available data has been corrected, the operation of the system is completed, and the DONE route is taken from block 88.

If at test block 87 any of the counters 38, 40 and 42 is found to be equal to 8191, that counter is reset to 0 at block 91. This implements the circular nature of the memory since after processing, reading or writing the highest numbered memory bytes, the next ones called for will be those with the lowest location number. This feature is preferably implemented by a 13 bit counter.

If at block 87 none of counters 38, 40 and 42 is equal to 8191, then block 90 is entered.

At block 90 read, write and process counters 38, 40 and 42 are incremented by 32.

Returning now to the flow of FIG. 9, at test block 84, input logic 28 signals microsequencer 22 if data bytes are present in its write buffer. If so, at block 74, 32 consecutive bytes of data are written into 32 adjacent locations in RAM 32 beginning at the C1 block location specified by write counter 40 (see horizontal line 1000 in FIG. 8. This location is always just ahead of the C1 block processed during the first pass of the C1 decoder (indicated at 1002 in FIG. 8). If at test block 84 no data is present in the write buffer of input logic 28, program flow continues to block 76. The next C1 data block is then processed using methods already described.

In summary then the method is to process or decode each data byte four times; by a C1 decoder, then a C2 decoder, then a second pass with the C1 decoder, and a second pass with the C2 decoder. In order to accomplish multiple pass decoding, it is necessary that no data bytes be discarded, as in prior art methods, following the first processing or pass of either the C1 or C2 decoders. In order to accomplish the rearrangement (de-interleaving) of data bytes required to neutralize the effects of burst errors, offsets included in decoding instructions are used. The same sequence of decoding instructions and offsets are continually executed. The reading frame of the decoders, as well as that of read and write operations, is advanced through the memory RAM 32 by summing the offset in each instruction with the value in the appropriate one of the counters 38, 40 and 42. Both passes of both the C1 and C2 decoders operate with reference to a single counter, process counter 42, while read and write operations in RAM 32 utilize separate read 38 and write 40 counters.

EXAMPLE

Consider now an example illustrating the theory of the operation of the present invention without specifically discussing the two-pass process. As a first step in the encoding process, an octal or binary number must be represented as a Galois number. The appropriate relationship is specified by a primitive polynomial. Preferably this polynomial is $$X^8 + X^4 + X^3 + X^2 + 1 \qquad \text{Equation (21)}$$

where X is any element of a Galois field. $\alpha$ is chosen to be a root of this polynomial and is an element of the field. Because the order of the primitive polynomial is 8, $\alpha$ can represent 256 different numbers as $\alpha^n$ where n may be any integer from 0 to 255. The numbers specified by the powers of $\alpha$ are shown in Table 3. The power of $\alpha$ corresponding to octal numbers is shown in Table 4. A discussion of the mathematical details may be found in the above referenced book entitled *Error-Correcting Codes* by Peterson and Weldon, supra.

A hypothetical block of data bytes of 24 data bytes is shown in Table 5. For convenience, the octal value of the data byte is given in the second column. The corresponding power of $\alpha$ is shown in the third column for each Galois representation of $\alpha$. As shown in the sequence of Table 6, a block of data is formed using the entries of the third column of Table 5 as coefficients.

It should be understood that the magnitude of the digital data carried by the code is contained in the coefficients. These coefficients are always powers of the irreducible root represented by $\alpha$. The data bytes manipulated in the encoding and decoding operations are binary representations of these coefficients.

In the actual encoding operation, the data block is divided by the generator polynomial $$X^4 + \alpha^{75}*X^3 + \alpha^{249}*X^2 + \alpha^{78}*X + \alpha^6 \qquad \text{Equation (22)}$$

The generator polynomial is the product of four factors $$(X+\alpha^0), (X+\alpha^1), (X+\alpha^2), (X+\alpha^3) \qquad \text{Equation (23)}$$

multiplied according to the rules of the Galois field described in the above MIT Press publication. The effect of division by the generator polynomial is to add four low order bytes $$(\alpha^{119}X^3, \alpha^{250}X^2, \alpha^{241}X, \alpha^{253}) \qquad \text{Equation (24)}$$

to the data polynomial as shown in Table 6.

The effect of encoding on a data polynomial may be seen in Table 6. Twenty-eight byte blocks are encoded using a similar procedure.

The steps executed by a C2 decoder (as described herein) in processing the hypothetical data block of FIG. 6 in the presence of no errors, one, two and many errors, will now be discussed. Table 7 shows the data block with no errors. As a first step in the decoding process, four syndromes, corresponding to the four factors of the generator polynomial, are calculated. The result, shown in Table 8, indicates that all four syndromes are zero, indicating the absence of any errors in the transmitted data block.

Table 9 represents an example of a single error in the hypothetical data block. Here byte 9 (indicated by *) has been received as $\alpha^{254}$ instead of $\alpha^{189}$ because the 1st and 3rd bits were set to 1 instead of zero and the 6th bit was changed to 1. Since an error is present, the syndromes are non-zero as indicated in Table 10. When symbol ratios $S_3/S_2$, $S_2/S_1$, and $S_1/S_0$ are computed they are all equal, as indicated under the heading "Correction Routine" in FIG. 10, indicating the presence of a single error. The error is the syndrome $S_0$ (here $\alpha^{37}$) and the location of the error is indicated by the syndrome ratio (here $\alpha^{10}$), corresponding to location 9 of the data block. Correction of erroneous bytes is effected by adding, modulo two, the numbers corresponding to $\alpha^{37}$ and $\alpha^{254}$. The result is $\alpha^{183}$ which is the correct value of this byte at this location.

An example in which two errors are present in the received data is shown in FIG. 11. The syndromes corresponding to this data block are shown in FIG. 12. Since the ratios of these syndromes are not equal, more than one error may be assumed to be present. The roots of the error locator polynomial, obtained by the method outlined in FIG. 11, are found to be $\alpha^2$ and $\alpha^7$. These values indicate the locations of the erroneous data bytes. Together with the syndromes, they can be used to determine the actual errors (here $\alpha^{246}$ and $\alpha^{163}$). By adding these errors to the data, correction of erroneous data bytes will be carried out.

Seven errors have been introduced into the hypothetical data block of the previous examples in the example of Table 13. This data block includes both point errors (locations 3, 16 and 25) and burst errors (locations 8 through 11). Table 14 shows that the syndrome locations are non-zero, indicating the presence of errors in the data block. Table 15 shows that the syndrome ratios are not equal, demonstrating the presence of more than one error. The error locator polynomial equation (also shown in Table 15) does not have two roots between $\alpha^0$ and $\alpha^{27}$. As a result the error is not correctable.

A representational example of the performance of a two pass system may be seen in FIGS. 25A through 25E. A section of system RAM 32 is shown wherein an open box represents a correct byte, an "X" represents an incorrect byte, and a "0" represents an incorrect byte which is corrected during a specific portion of the decoding cycle.

FIG. 25A represents the data prior to any decoding, using the X,Y Cartesian coordinate system described earlier. Only every 4th row is shown and it will be assumed for clarity in the example that the entire system RAM 32 is processed by either the C1 or C2 decoder before proceeding to the next C1 or C2 decoder.

In FIG. 25B, the first C1 decoder is implemented, correcting the incorrect bytes in Y rows 0 and 16. The data in rows 4, 8 and 12 is uncorrectable since each row has more than two errors.

The first C2 decoder is then executed, correcting the bytes in rows 4 and 12. The diagonal rows of errors (Y−4, X−25), (Y−8, X−26) and (Y−12, X−27) is still uncorrectable since they all lie within the same C2 block.

The second C1 decoder corrects two of these bytes, in rows 4 and 12, in FIG. 25D since both rows 4 and 12 now contain only one error.

Finally the second C2 decoder corrects the data bytes in row 12 in FIG. 25E, leaving the two erroneous parity bytes in row 8.

The tables include equations that do not include the Galois notation "*" between terms to be multiplied. This has been done for convenience but it is to be understood that Galois multiplication is implied.

Although one embodiment of the invention has been disclosed, by way of example, other embodiments will be obvious to those skilled in the art. By way of example, the disclosed embodiment discloses one system memory and associated components for performing decoding operations. Alternatively a plurality of such system memories may be used to perform the multiple decoder pass operations.

Figure 24:
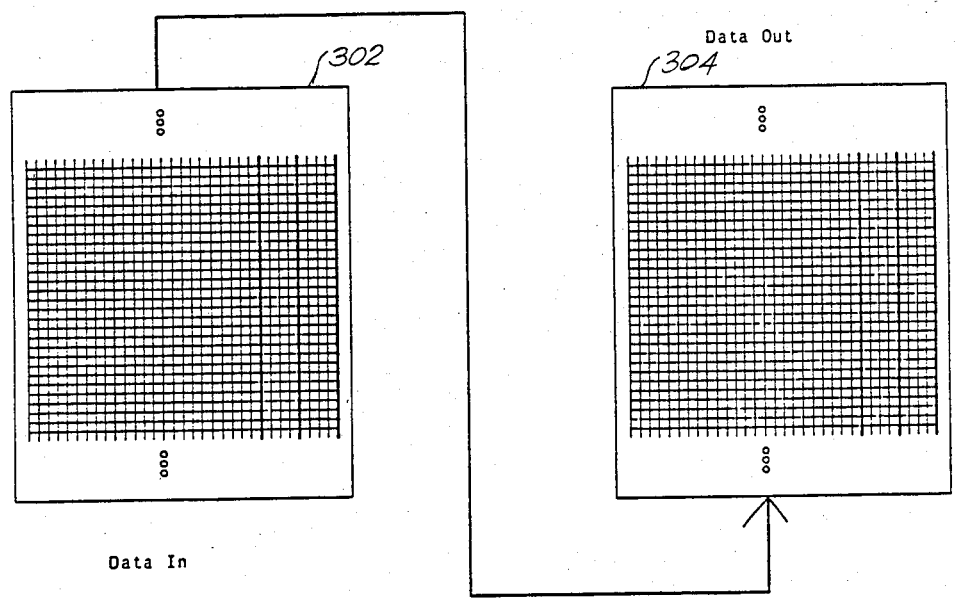
FIG. 24 is a block diagram of an alternative implementation and embodies the present invention.

Referring to FIG. 24 as a specific example, two separate system memories and associated components 302 and 304 may be employed where the memory and associated components 302 perform the first pass through the C1 and C2 decoding method, and the second memory and components 304 are used for the second pass through the C1 and C2 decoding method. The data bytes are transferred in the form of C1 data blocks (i.e., 32 contiguous bytes) from the memory and associated components 302 to the memory and associated components 304 after the first pass by the C1 and C2 decoding method where they are then processed by the second pass of the C1 and C2 decoding method.

Although an exemplary embodiment of the invention has been disclosed for purposes of illustration, it will be understood that various changes, modifications and substitutions may be incorporated into such embodiment without departing from the spirit of the invention as defined by the claims appearing hereinafter.

TABLE 1

| First Decoder Cycle | |
|---|---|
| Bytes of C1 block, first pass 3584, 3585, 3586, 3587, . . . 3615 | (Y index = 112) |
| Bytes of C2 block, first pass 0, 129, 258, 387 . . . 3483 | (Y index = 0 to 108) |
| Bytes of C1 block, second pass 7680, 7681, 7682, 7683, . . . 7711 | (Y index = 240) |
| Bytes of C2 block, second pass 4028, 4257, 4386, 4483 . . . 7611 | (Y index = 128 to 236) |
| Second Decoder Cycle | |
| C1 block, first pass 3616, 3617, 3618 . . . 3647 | (Y index = 113) |
| C2 block, first pass 32, 161, 290, 419, . . . 3515 | (Y index = 1 to 109) |
| C1 block, second pass 7712, 7713, 7714, 7715 . . . 7743 | (Y index = 241) |
| C2 block, second pass 4096, 4225, 4354, 4483 . . . 7579 | (Y index = 129 to 237) |
| Third Decoder Cycle | |
| First C1 block 3648, 3649, 3650, 3651 . . . 3679 | (Y index = 114) |
| First C2 block 64, 193, 322, 451, . . . 3547 | (Y index = 2 to 110) |
| Second C1 block 7744, 7745, 7746, 7747, . . . 7775 | (Y index = 242) |
| Second C2 block 4160, 4289, 4418, 4547, . . . 7643 | (Y index = 130 to 238) |

TABLE 1-A

EQUATIONS FOR DETERMINING C1 and C2
DATA BYTE ADDRESS IN RAM 32

Bytes of C1 block first pass:
(1) PC + 3584 + K, where K = 0 to 31
Bytes of C2 block first pass:
(2) PC + 129 · K, where K = 0 to 27
Bytes of C1 block second pass:
(3) PC + 7680 + K, where K = 0 to 31
Bytes of C2 block second pass:
(4) PC + 4096 + 129 · K, where K = 0 to 27
where PC = value in process counter 42

TABLE 2
COORDINATES OF C2 BLOCK AND BYTE NUMBERS FOR THREE DECODER CYCLES

| First Cycle | | | Second Cycle | | | Third Cycle | | |
|---|---|---|---|---|---|---|---|---|
| X | Y | Byte # | X | Y | Byte # | X | Y | Byte # |
| 0 | 0 | 0 | 0 | 1 | 32 | 0 | 2 | 64 |
| 1 | 4 | 129 | 1 | 5 | 161 | 1 | 6 | 193 |
| 2 | 8 | 258 | 2 | 9 | 290 | 2 | 10 | 322 |
| 3 | 12 | 387 | 3 | 13 | 419 | 3 | 14 | 451 |
| 4 | 16 | 516 | 4 | 17 | 548 | 4 | 18 | 580 |
| 5 | 20 | 645 | 5 | 21 | 677 | 5 | 22 | 709 |
| 6 | 24 | 777 | 6 | 25 | 806 | 6 | 26 | 838 |
| 7 | 28 | 903 | 7 | 29 | 935 | 7 | 30 | 967 |
| 8 | 32 | 1032 | 8 | 33 | 1064 | 8 | 34 | 1096 |
| 9 | 36 | 1161 | 9 | 37 | 1193 | 9 | 38 | 1225 |
| 10 | 40 | 1290 | 10 | 41 | 1322 | 10 | 42 | 1354 |
| 11 | 44 | 1419 | 11 | 45 | 1451 | 11 | 46 | 1483 |
| 12 | 48 | 1548 | 12 | 49 | 1580 | 12 | 50 | 1612 |
| 13 | 52 | 1677 | 13 | 53 | 1709 | 13 | 54 | 1741 |
| 14 | 56 | 1806 | 14 | 57 | 1836 | 14 | 58 | 1870 |
| 15 | 60 | 1935 | 15 | 61 | 1967 | 15 | 62 | 1999 |
| 16 | 64 | 2064 | 16 | 65 | 2096 | 16 | 66 | 2128 |
| 17 | 68 | 2193 | 17 | 69 | 2225 | 17 | 70 | 2257 |
| 18 | 72 | 2322 | 18 | 73 | 2354 | 18 | 74 | 2386 |
| 19 | 76 | 2451 | 19 | 77 | 2483 | 19 | 78 | 2515 |
| 20 | 80 | 2580 | 20 | 81 | 2612 | 20 | 82 | 2641 |
| 21 | 84 | 2709 | 21 | 85 | 2741 | 21 | 86 | 2773 |
| 22 | 88 | 2838 | 22 | 89 | 2870 | 22 | 90 | 2902 |
| 23 | 92 | 2967 | 23 | 93 | 2999 | 23 | 94 | 3031 |
| 24 | 96 | 3096 | 24 | 97 | 3128 | 24 | 98 | 3160 |
| 25 | 100 | 3225 | 25 | 101 | 3257 | 25 | 102 | 3289 |
| 26 | 104 | 3354 | 26 | 105 | 3386 | 26 | 106 | 3418 |
| 27 | 108 | 3483 | 27 | 109 | 3515 | 27 | 110 | 3547 |

TABLE 3
GALOIS LOOKUP TABLE
Primitive Polynomial
$$x^8 + x^4 + x^3 + x^2 + 1$$
Galois to Binary Table

| | | | | | | | |
|---|---|---|---|---|---|---|---|
| $\alpha^0$ | 1 | $\alpha^{64}$ | 137 | $\alpha^{128}$ | 205 | $\alpha^{192}$ | 202 |
| $\alpha^1$ | 2 | $\alpha^{65}$ | 276 | $\alpha^{129}$ | 27 | $\alpha^{193}$ | 31 |
| $\alpha^2$ | 4 | $\alpha^{66}$ | 141 | $\alpha^{130}$ | 56 | $\alpha^{194}$ | 62 |
| $\alpha^3$ | 10 | $\alpha^{67}$ | 302 | $\alpha^{131}$ | 134 | $\alpha^{195}$ | 144 |
| $\alpha^4$ | 20 | $\alpha^{68}$ | 231 | $\alpha^{132}$ | 270 | $\alpha^{196}$ | 310 |
| $\alpha^5$ | 40 | $\alpha^{69}$ | 57 | $\alpha^{133}$ | 155 | $\alpha^{197}$ | 215 |
| $\alpha^6$ | 100 | $\alpha^{70}$ | 136 | $\alpha^{134}$ | 332 | $\alpha^{198}$ | 7 |
| $\alpha^7$ | 200 | $\alpha^{71}$ | 274 | $\alpha^{135}$ | 251 | $\alpha^{199}$ | 16 |
| $\alpha^8$ | 35 | $\alpha^{72}$ | 145 | $\alpha^{136}$ | 117 | $\alpha^{200}$ | 34 |
| $\alpha^9$ | 72 | $\alpha^{73}$ | 312 | $\alpha^{137}$ | 236 | $\alpha^{201}$ | 70 |
| $\alpha^{10}$ | 164 | $\alpha^{74}$ | 211 | $\alpha^{138}$ | 41 | $\alpha^{202}$ | 160 |
| $\alpha^{11}$ | 350 | $\alpha^{75}$ | 17 | $\alpha^{139}$ | 102 | $\alpha^{203}$ | 340 |
| $\alpha^{12}$ | 315 | $\alpha^{76}$ | 36 | $\alpha^{140}$ | 204 | $\alpha^{204}$ | 335 |
| $\alpha^{13}$ | 207 | $\alpha^{77}$ | 74 | $\alpha^{141}$ | 25 | $\alpha^{205}$ | 247 |
| $\alpha^{14}$ | 23 | $\alpha^{78}$ | 170 | $\alpha^{142}$ | 52 | $\alpha^{206}$ | 123 |
| $\alpha^{15}$ | 46 | $\alpha^{79}$ | 360 | $\alpha^{143}$ | 124 | $\alpha^{207}$ | 246 |
| $\alpha^{16}$ | 114 | $\alpha^{80}$ | 375 | $\alpha^{144}$ | 250 | $\alpha^{208}$ | 121 |
| $\alpha^{17}$ | 230 | $\alpha^{81}$ | 347 | $\alpha^{145}$ | 115 | $\alpha^{209}$ | 242 |
| $\alpha^{18}$ | 55 | $\alpha^{82}$ | 323 | $\alpha^{146}$ | 232 | $\alpha^{210}$ | 131 |
| $\alpha^{19}$ | 132 | $\alpha^{83}$ | 273 | $\alpha^{147}$ | 51 | $\alpha^{211}$ | 262 |
| $\alpha^{20}$ | 264 | $\alpha^{84}$ | 153 | $\alpha^{148}$ | 122 | $\alpha^{212}$ | 171 |
| $\alpha^{21}$ | 165 | $\alpha^{85}$ | 326 | $\alpha^{149}$ | 244 | $\alpha^{213}$ | 362 |
| $\alpha^{22}$ | 352 | $\alpha^{86}$ | 261 | $\alpha^{150}$ | 125 | $\alpha^{214}$ | 371 |
| $\alpha^{23}$ | 311 | $\alpha^{87}$ | 177 | $\alpha^{151}$ | 252 | $\alpha^{215}$ | 357 |
| $\alpha^{24}$ | 217 | $\alpha^{88}$ | 376 | $\alpha^{152}$ | 111 | $\alpha^{216}$ | 303 |
| $\alpha^{25}$ | 3 | $\alpha^{89}$ | 341 | $\alpha^{153}$ | 222 | $\alpha^{217}$ | 233 |
| $\alpha^{26}$ | 6 | $\alpha^{90}$ | 337 | $\alpha^{154}$ | 71 | $\alpha^{218}$ | 53 |
| $\alpha^{27}$ | 14 | $\alpha^{91}$ | 243 | $\alpha^{155}$ | 162 | $\alpha^{219}$ | 126 |
| $\alpha^{28}$ | 80 | $\alpha^{92}$ | 133 | $\alpha^{156}$ | 344 | $\alpha^{220}$ | 254 |
| $\alpha^{29}$ | 60 | $\alpha^{93}$ | 266 | $\alpha^{157}$ | 325 | $\alpha^{221}$ | 105 |
| $\alpha^{30}$ | 140 | $\alpha^{94}$ | 161 | $\alpha^{158}$ | 267 | $\alpha^{222}$ | 212 |
| $\alpha^{31}$ | 300 | $\alpha^{95}$ | 342 | $\alpha^{159}$ | 163 | $\alpha^{223}$ | 11 |
| $\alpha^{32}$ | 235 | $\alpha^{96}$ | 331 | $\alpha^{160}$ | 346 | $\alpha^{224}$ | 22 |
| $\alpha^{33}$ | 47 | $\alpha^{97}$ | 257 | $\alpha^{161}$ | 321 | $\alpha^{225}$ | 44 |
| $\alpha^{34}$ | 116 | $\alpha^{98}$ | 103 | $\alpha^{162}$ | 277 | $\alpha^{226}$ | 110 |
| $\alpha^{35}$ | 234 | $\alpha^{99}$ | 206 | $\alpha^{163}$ | 143 | $\alpha^{227}$ | 220 |
| $\alpha^{36}$ | 45 | $\alpha^{100}$ | 21 | $\alpha^{164}$ | 306 | $\alpha^{228}$ | 75 |
| $\alpha^{37}$ | 112 | $\alpha^{101}$ | 42 | $\alpha^{165}$ | 221 | $\alpha^{229}$ | 172 |
| $\alpha^{38}$ | 224 | $\alpha^{102}$ | 104 | $\alpha^{166}$ | 77 | $\alpha^{230}$ | 364 |

TABLE 3-continued
GALOIS LOOKUP TABLE
Primitive Polynomial
$$x^8 + x^4 + x^3 + x^2 + 1$$
Galois to Binary Table

| | | | | | | | |
|---|---|---|---|---|---|---|---|
| $\alpha^{39}$ | 65 | $\alpha^{103}$ | 210 | $\alpha^{167}$ | 176 | $\alpha^{231}$ | 365 |
| $\alpha^{40}$ | 152 | $\alpha^{104}$ | 15 | $\alpha^{168}$ | 374 | $\alpha^{232}$ | 367 |
| $\alpha^{41}$ | 324 | $\alpha^{105}$ | 82 | $\alpha^{169}$ | 345 | $\alpha^{233}$ | 363 |
| $\alpha^{42}$ | 265 | $\alpha^{106}$ | 64 | $\alpha^{170}$ | 327 | $\alpha^{234}$ | 373 |
| $\alpha^{43}$ | 167 | $\alpha^{107}$ | 150 | $\alpha^{171}$ | 263 | $\alpha^{235}$ | 353 |
| $\alpha^{44}$ | 356 | $\alpha^{108}$ | 320 | $\alpha^{172}$ | 173 | $\alpha^{236}$ | 313 |
| $\alpha^{45}$ | 301 | $\alpha^{109}$ | 275 | $\alpha^{173}$ | 366 | $\alpha^{237}$ | 213 |
| $\alpha^{46}$ | 237 | $\alpha^{110}$ | 147 | $\alpha^{174}$ | 361 | $\alpha^{238}$ | 13 |
| $\alpha^{47}$ | 43 | $\alpha^{111}$ | 316 | $\alpha^{175}$ | 377 | $\alpha^{239}$ | 26 |
| $\alpha^{48}$ | 106 | $\alpha^{112}$ | 201 | $\alpha^{176}$ | 343 | $\alpha^{240}$ | 54 |
| $\alpha^{49}$ | 214 | $\alpha^{113}$ | 37 | $\alpha^{177}$ | 333 | $\alpha^{241}$ | 130 |
| $\alpha^{50}$ | 5 | $\alpha^{114}$ | 76 | $\alpha^{178}$ | 253 | $\alpha^{242}$ | 260 |
| $\alpha^{51}$ | 12 | $\alpha^{115}$ | 174 | $\alpha^{179}$ | 113 | $\alpha^{243}$ | 175 |
| $\alpha^{52}$ | 24 | $\alpha^{116}$ | 370 | $\alpha^{180}$ | 226 | $\alpha^{244}$ | 372 |
| $\alpha^{53}$ | 50 | $\alpha^{117}$ | 355 | $\alpha^{181}$ | 61 | $\alpha^{245}$ | 351 |
| $\alpha^{54}$ | 120 | $\alpha^{118}$ | 307 | $\alpha^{182}$ | 142 | $\alpha^{246}$ | 317 |
| $\alpha^{55}$ | 240 | $\alpha^{119}$ | 223 | $\alpha^{183}$ | 304 | $\alpha^{247}$ | 203 |
| $\alpha^{56}$ | 135 | $\alpha^{120}$ | 73 | $\alpha^{184}$ | 225 | $\alpha^{248}$ | 33 |
| $\alpha^{57}$ | 272 | $\alpha^{121}$ | 166 | $\alpha^{185}$ | 67 | $\alpha^{249}$ | 66 |
| $\alpha^{58}$ | 151 | $\alpha^{122}$ | 354 | $\alpha^{186}$ | 156 | $\alpha^{250}$ | 154 |
| $\alpha^{59}$ | 322 | $\alpha^{123}$ | 305 | $\alpha^{187}$ | 334 | $\alpha^{251}$ | 330 |
| $\alpha^{60}$ | 271 | $\alpha^{124}$ | 227 | $\alpha^{188}$ | 245 | $\alpha^{252}$ | 255 |
| $\alpha^{61}$ | 157 | $\alpha^{125}$ | 63 | $\alpha^{189}$ | 127 | $\alpha^{253}$ | 107 |
| $\alpha^{62}$ | 336 | $\alpha^{126}$ | 146 | $\alpha^{190}$ | 256 | $\alpha^{254}$ | 216 |
| $\alpha^{63}$ | 241 | $\alpha^{127}$ | 314 | $\alpha^{191}$ | 101 | $\alpha^{255}$ | 1 |

TABLE 4
Binary to Galois Table

| | | | | | | | |
|---|---|---|---|---|---|---|---|
| 1 | $\alpha^0$ | 101 | $\alpha^{191}$ | 201 | $\alpha^{112}$ | 301 | $\alpha^{45}$ |
| 2 | $\alpha^1$ | 102 | $\alpha^{139}$ | 202 | $\alpha^{192}$ | 302 | $\alpha^{67}$ |
| 3 | $\alpha^{25}$ | 103 | $\alpha^{98}$ | 203 | $\alpha^{247}$ | 303 | $\alpha^{216}$ |

TABLE 4-continued

Binary to Galois Table

| | | | | | | | |
|---|---|---|---|---|---|---|---|
| 4 | $\alpha^2$ | 104 | $\alpha^{102}$ | 204 | $\alpha^{140}$ | 304 | $\alpha^{183}$ |
| 5 | $\alpha^{50}$ | 105 | $\alpha^{221}$ | 205 | $\alpha^{128}$ | 305 | $\alpha^{123}$ |
| 6 | $\alpha^{26}$ | 106 | $\alpha^{48}$ | 206 | $\alpha^{99}$ | 306 | $\alpha^{164}$ |
| 7 | $\alpha^{198}$ | 107 | $\alpha^{253}$ | 207 | $\alpha^{13}$ | 307 | $\alpha^{118}$ |
| 10 | $\alpha^3$ | 110 | $\alpha^{226}$ | 210 | $\alpha^{103}$ | 310 | $\alpha^{196}$ |
| 11 | $\alpha^{223}$ | 111 | $\alpha^{152}$ | 211 | $\alpha^{74}$ | 311 | $\alpha^{23}$ |
| 12 | $\alpha^{51}$ | 112 | $\alpha^{37}$ | 212 | $\alpha^{222}$ | 312 | $\alpha^{73}$ |
| 13 | $\alpha^{238}$ | 113 | $\alpha^{179}$ | 213 | $\alpha^{237}$ | 313 | $\alpha^{236}$ |
| 14 | $\alpha^{27}$ | 114 | $\alpha^{16}$ | 214 | $\alpha^{49}$ | 314 | $\alpha^{127}$ |
| 15 | $\alpha^{104}$ | 115 | $\alpha^{145}$ | 215 | $\alpha^{197}$ | 315 | $\alpha^{12}$ |
| 16 | $\alpha^{199}$ | 116 | $\alpha^{34}$ | 216 | $\alpha^{254}$ | 316 | $\alpha^{111}$ |
| 17 | $\alpha^{75}$ | 117 | $\alpha^{136}$ | 217 | $\alpha^{24}$ | 317 | $\alpha^{246}$ |
| 20 | $\alpha^4$ | 120 | $\alpha^{54}$ | 220 | $\alpha^{227}$ | 320 | $\alpha^{108}$ |
| 21 | $\alpha^{100}$ | 121 | $\alpha^{208}$ | 221 | $\alpha^{165}$ | 321 | $\alpha^{161}$ |
| 22 | $\alpha^{224}$ | 122 | $\alpha^{148}$ | 222 | $\alpha^{153}$ | 322 | $\alpha^{59}$ |
| 23 | $\alpha^{14}$ | 123 | $\alpha^{206}$ | 223 | $\alpha^{119}$ | 323 | $\alpha^{82}$ |
| 24 | $\alpha^{52}$ | 124 | $\alpha^{143}$ | 224 | $\alpha^{38}$ | 324 | $\alpha^{41}$ |
| 25 | $\alpha^{141}$ | 125 | $\alpha^{150}$ | 225 | $\alpha^{184}$ | 325 | $\alpha^{157}$ |
| 26 | $\alpha^{239}$ | 126 | $\alpha^{219}$ | 226 | $\alpha^{180}$ | 326 | $\alpha^{85}$ |
| 27 | $\alpha^{129}$ | 127 | $\alpha^{124}$ | 227 | $\alpha^{124}$ | 327 | $\alpha^{170}$ |
| 30 | $\alpha^{28}$ | 130 | $\alpha^{241}$ | 230 | $\alpha^{17}$ | 330 | $\alpha^{251}$ |
| 31 | $\alpha^{193}$ | 131 | $\alpha^{210}$ | 231 | $\alpha^{68}$ | 331 | $\alpha^{96}$ |
| 32 | $\alpha^{105}$ | 132 | $\alpha^{19}$ | 232 | $\alpha^{146}$ | 332 | $\alpha^{134}$ |
| 33 | $\alpha^{248}$ | 133 | $\alpha^{92}$ | 233 | $\alpha^{217}$ | 333 | $\alpha^{177}$ |
| 34 | $\alpha^{200}$ | 134 | $\alpha^{131}$ | 234 | $\alpha^{35}$ | 334 | $\alpha^{187}$ |
| 35 | $\alpha^8$ | 135 | $\alpha^{56}$ | 235 | $\alpha^{32}$ | 335 | $\alpha^{204}$ |
| 36 | $\alpha^{76}$ | 136 | $\alpha^{70}$ | 236 | $\alpha^{137}$ | 336 | $\alpha^{62}$ |
| 37 | $\alpha^{113}$ | 137 | $\alpha^{64}$ | 237 | $\alpha^{46}$ | 337 | $\alpha^{90}$ |
| 40 | $\alpha^5$ | 140 | $\alpha^{30}$ | 240 | $\alpha^{55}$ | 340 | $\alpha^{203}$ |
| 41 | $\alpha^{138}$ | 141 | $\alpha^{66}$ | 241 | $\alpha^{63}$ | 341 | $\alpha^{89}$ |
| 42 | $\alpha^{101}$ | 142 | $\alpha^{182}$ | 242 | $\alpha^{209}$ | 342 | $\alpha^{95}$ |
| 43 | $\alpha^{47}$ | 143 | $\alpha^{163}$ | 243 | $\alpha^{91}$ | 343 | $\alpha^{176}$ |
| 44 | $\alpha^{225}$ | 144 | $\alpha^{195}$ | 244 | $\alpha^{149}$ | 344 | $\alpha^{156}$ |
| 45 | $\alpha^{36}$ | 145 | $\alpha^{72}$ | 245 | $\alpha^{188}$ | 345 | $\alpha^{169}$ |
| 46 | $\alpha^{15}$ | 146 | $\alpha^{126}$ | 246 | $\alpha^{207}$ | 346 | $\alpha^{160}$ |
| 47 | $\alpha^{33}$ | 147 | $\alpha^{110}$ | 247 | $\alpha^{205}$ | 347 | $\alpha^{81}$ |
| 50 | $\alpha^{53}$ | 150 | $\alpha^{107}$ | 250 | $\alpha^{144}$ | 350 | $\alpha^{11}$ |
| 51 | $\alpha^{147}$ | 151 | $\alpha^{58}$ | 251 | $\alpha^{135}$ | 351 | $\alpha^{245}$ |
| 52 | $\alpha^{142}$ | 152 | $\alpha^{40}$ | 252 | $\alpha^{151}$ | 352 | $\alpha^{22}$ |
| 53 | $\alpha^{218}$ | 153 | $\alpha^{84}$ | 253 | $\alpha^{178}$ | 353 | $\alpha^{235}$ |
| 54 | $\alpha^{240}$ | 154 | $\alpha^{250}$ | 254 | $\alpha^{220}$ | 354 | $\alpha^{122}$ |
| 55 | $\alpha^{18}$ | 155 | $\alpha^{133}$ | 255 | $\alpha^{252}$ | 355 | $\alpha^{117}$ |
| 56 | $\alpha^{130}$ | 156 | $\alpha^{186}$ | 256 | $\alpha^{190}$ | 356 | $\alpha^{44}$ |
| 57 | $\alpha^{69}$ | 157 | $\alpha^{61}$ | 257 | $\alpha^{97}$ | 357 | $\alpha^{215}$ |
| 60 | $\alpha^{29}$ | 160 | $\alpha^{202}$ | 260 | $\alpha^{242}$ | 360 | $\alpha^{79}$ |
| 61 | $\alpha^{181}$ | 161 | $\alpha^{94}$ | 261 | $\alpha^{86}$ | 361 | $\alpha^{174}$ |
| 62 | $\alpha^{142}$ | 162 | $\alpha^{155}$ | 262 | $\alpha^{211}$ | 362 | $\alpha^{213}$ |
| 63 | $\alpha^{125}$ | 163 | $\alpha^{159}$ | 263 | $\alpha^{171}$ | 363 | $\alpha^{233}$ |
| 64 | $\alpha^{106}$ | 164 | $\alpha^{10}$ | 264 | $\alpha^{20}$ | 364 | $\alpha^{230}$ |
| 65 | $\alpha^{39}$ | 165 | $\alpha^{21}$ | 265 | $\alpha^{42}$ | 365 | $\alpha^{231}$ |
| 66 | $\alpha^{249}$ | 166 | $\alpha^{121}$ | 266 | $\alpha^{93}$ | 366 | $\alpha^{173}$ |
| 67 | $\alpha^{185}$ | 167 | $\alpha^{43}$ | 267 | $\alpha^{158}$ | 367 | $\alpha^{232}$ |
| 70 | $\alpha^{201}$ | 170 | $\alpha^{78}$ | 270 | $\alpha^{132}$ | 370 | $\alpha^{116}$ |
| 71 | $\alpha^{154}$ | 171 | $\alpha^{212}$ | 271 | $\alpha^{60}$ | 371 | $\alpha^{214}$ |
| 72 | $\alpha^9$ | 172 | $\alpha^{229}$ | 272 | $\alpha^{57}$ | 372 | $\alpha^{244}$ |
| 73 | $\alpha^{120}$ | 173 | $\alpha^{172}$ | 273 | $\alpha^{83}$ | 373 | $\alpha^{234}$ |
| 74 | $\alpha^{77}$ | 174 | $\alpha^{115}$ | 274 | $\alpha^{71}$ | 374 | $\alpha^{168}$ |
| 75 | $\alpha^{228}$ | 175 | $\alpha^{243}$ | 275 | $\alpha^{109}$ | 375 | $\alpha^{80}$ |
| 76 | $\alpha^{114}$ | 176 | $\alpha^{167}$ | 276 | $\alpha^{65}$ | 376 | $\alpha^{88}$ |
| 77 | $\alpha^{166}$ | 177 | $\alpha^{87}$ | 277 | $\alpha^{162}$ | 377 | $\alpha^{175}$ |
| 100 | $\alpha^6$ | 200 | $\alpha^7$ | 300 | $\alpha^{31}$ | | |

TABLE 5

Reed Solomon Encoder

The Generator Polynomial
$$x^4 + \alpha^{75}x^3 + \alpha^{249}x^2 + \alpha^{78}x + \alpha^6 = (x + \alpha^0)(x + \alpha^1)(x + \alpha^2)(x + \alpha^3)$$

Data Prior to Encoding

| Location | Data Byte | Galois Representation |
|---|---|---|
| 23 | 246 | $\alpha^{207}$ |
| 22 | 347 | $\alpha^{81}$ |
| 21 | 224 | $\alpha^{38}$ |
| 20 | 75 | $\alpha^{228}$ |
| 19 | 62 | $\alpha^{194}$ |
| 18 | 203 | $\alpha^{247}$ |
| 17 | 0 | 0 |
| 16 | 71 | $\alpha^{154}$ |
| 15 | 176 | $\alpha^{167}$ |
| 14 | 337 | $\alpha^{90}$ |
| 13 | 54 | $\alpha^{240}$ |
| 12 | 365 | $\alpha^{231}$ |
| 11 | 212 | $\alpha^{222}$ |
| 10 | 373 | $\alpha^{234}$ |
| 9 | 30 | $\alpha^{28}$ |
| 8 | 161 | $\alpha^{94}$ |
| 7 | 126 | $\alpha^{219}$ |
| 6 | 327 | $\alpha^{170}$ |
| 5 | 304 | $\alpha^{183}$ |
| 4 | 255 | $\alpha^{252}$ |
| 3 | 342 | $\alpha^{95}$ |
| 2 | 163 | $\alpha^{159}$ |
| 1 | 60 | $\alpha^{29}$ |
| 0 | 251 | $\alpha^{135}$ |

$\alpha^{207}x^{23} + \alpha^{81}x^{22} + \alpha^{38}x^{21} + \alpha^{228}x^{20} + \alpha^{194}x^{19} + \alpha^{247}x^{18} + 0x^{17} + \alpha^{154}x^{16} + \alpha^{167}x^{15} + \alpha^{90}x^{14} + \alpha^{240}x^{13} + \alpha^{231}x^{12} + \alpha^{222}x^{11} + \alpha^{234}x^{10} + \alpha^{28}x^9 + \alpha^{94}x^8 + \alpha^{219}x^7 + \alpha^{170}x^6 + \alpha^{183}x^5 + \alpha^{252}x^4 + \alpha^{95}x^3 + \alpha^{159}x^2 + \alpha^{29}x + \alpha^{135}$

TABLE 6

Data After Encoding $\alpha^{207}x^{27} + \alpha^{81}x^{26} + \alpha^{38}x^{25} + \alpha^{228}x^{24} + \alpha^{194}x^{23} + \alpha^{247}x^{22} + 0x^{21} + \alpha^{154}x^{20} + \alpha^{167}x^{19} + \alpha^{90}x^{18} + \alpha^{240}x^{17} + \alpha^{231}x^{16} + \alpha^{222}x^{15} + \alpha^{252}x^8 + \alpha^{95}x^7 + \alpha^{159}x^6 + \alpha^{29}x^5 + \alpha^{135}x^4 + \alpha^{119}x^3 + \alpha^{250}x^2 + \alpha^{241}x + \alpha^{253}$

TABLE 7

Reed Solomon Decoder
Data Prior to Decoding

| Location | Data Byte | Galois Representation |
|---|---|---|
| 27 | 246 | $\alpha^{207}$ |
| 26 | 347 | $\alpha^{81}$ |
| 25 | 224 | $\alpha^{38}$ |
| 24 | 75 | $\alpha^{228}$ |
| 23 | 62 | $\alpha^{194}$ |
| 22 | 203 | $\alpha^{247}$ |
| 21 | 0 | 0 |
| 20 | 71 | $\alpha^{154}$ |
| 19 | 176 | $\alpha^{167}$ |
| 18 | 337 | $\alpha^{90}$ |
| 17 | 54 | $\alpha^{240}$ |
| 16 | 365 | $\alpha^{231}$ |
| 15 | 212 | $\alpha^{222}$ |
| 14 | 373 | $\alpha^{234}$ |
| 13 | 30 | $\alpha^{28}$ |
| 12 | 161 | $\alpha^{94}$ |
| 11 | 126 | $\alpha^{219}$ |
| 10 | 327 | $\alpha^{170}$ |
| 9 | 304 | $\alpha^{183}$ |
| 8 | 255 | $\alpha^{252}$ |
| 7 | 342 | $\alpha^{95}$ |
| 6 | 163 | $\alpha^{159}$ |
| 5 | 60 | $\alpha^{29}$ |
| 4 | 251 | $\alpha^{135}$ |
| 3 | 223 | $\alpha^{119}$ |
| 2 | 154 | $\alpha^{250}$ |
| 1 | 130 | $\alpha^{241}$ |
| 0 | 107 | $\alpha^{253}$ |

$\alpha^{207}x^{27} + \alpha^{81}x^{26} + \alpha^{38}x^{25} + \alpha^{228}x^{24} + \alpha^{194}x^{23} + \alpha^{247}x^{22} + 0x^{21} + \alpha^{154}x^{20} + \alpha^{167}x^{19} + \alpha^{90}x^{18} + \alpha^{240}x^{17} + \alpha^{231}x^{16} + \alpha^{222}x^{15} + \alpha^{234}x^{14} + \alpha^{28}x^{13} + \alpha^{94}x^{12} + \alpha^{219}x^{11} + \alpha^{170}x^{10} = \alpha^{183}x^9 + \alpha^{252}x^8 + \alpha^{95}x^7 + \alpha^{159}x^6 + \alpha^{29}x^5 + \alpha^{135}x^4 + \alpha^{119}x^3 + \alpha^{250}x^2 + \alpha^{241}x + \alpha^{253}$

TABLE 8

| Syndrome calculation | | |
|---|---|---|
| Syndome 0 is | 0 | 0 |
| Syndome 1 is | 0 | 0 |
| Syndome 2 is | 0 | 0 |
| Syndome 3 is | 0 | 0 |
| Correction Routine | | |
| All syndromes are zero | | |

TABLE 9

Reed Solomon Decoder
Data Prior to Decoding

| Location | Data Byte | Galois Representation |
|---|---|---|
| 27 | 246 | $\alpha^{207}$ |
| 26 | 347 | $\alpha^{81}$ |
| 25 | 224 | $\alpha^{38}$ |
| 24 | 75 | $\alpha^{228}$ |
| 23 | 62 | $\alpha^{194}$ |
| 22 | 203 | $\alpha^{247}$ |
| 21 | 0 | 0 |
| 20 | 71 | $\alpha^{154}$ |
| 19 | 176 | $\alpha^{167}$ |
| 18 | 337 | $\alpha^{90}$ |
| 17 | 54 | $\alpha^{240}$ |
| 16 | 365 | $\alpha^{231}$ |
| 15 | 212 | $\alpha^{222}$ |
| 14 | 373 | $\alpha^{234}$ |
| 13 | 30 | $\alpha^{28}$ |
| 12 | 161 | $\alpha^{94}$ |
| 11 | 126 | $\alpha^{219}$ |
| 10 | 327 | $\alpha^{170}$ |
| *9 | 216 | $\alpha^{254}$ |
| 8 | 255 | $\alpha^{252}$ |
| 7 | 342 | $\alpha^{95}$ |
| 6 | 163 | $\alpha^{159}$ |
| 5 | 60 | $\alpha^{29}$ |
| 4 | 251 | $\alpha^{135}$ |
| 3 | 223 | $\alpha^{119}$ |
| 2 | 154 | $\alpha^{250}$ |
| 1 | 130 | $\alpha^{241}$ |
| 0 | 107 | $\alpha^{253}$ |

$\alpha^{207}x^{27} + \alpha^{81}x^{26} + \alpha^{38}x^{25} + \alpha^{228}x^{24} + \alpha^{194}x^{23} + \alpha^{247}x^{22} + 0x^{21} + \alpha^{154}x^{20} + \alpha^{167}x^{19} + \alpha^{90}x^{18} + \alpha^{240}x^{17} + \alpha^{231}x^{16} + \alpha^{222}x^{15} + \alpha^{234}x^{14} + \alpha^{28}x^{13} + \alpha^{94}x^{12} + \alpha^{219}x^{11} + \alpha^{170}x^{10} + \alpha^{254}x^9 + \alpha^{252}x^8 + \alpha^{95}x^7 + \alpha^{159}x^6 + \alpha^{29}x^5 + \alpha^{135}x^4 + \alpha^{119}x^3 + \alpha^{250}x^2 + \alpha^{241}x + \alpha^{253}$

TABLE 10

| Syndrome calculation | | |
|---|---|---|
| Syndome 0 is | 112 | $\alpha^{37}$ |
| Syndome 1 is | 43 | $\alpha^{47}$ |
| Syndome 2 is | 272 | $\alpha^{57}$ |
| Syndome 3 is | 302 | $\alpha^{67}$ |
| Correction Routine | | |
| Check for One Error | | |
| $S_3/S_2$ is $\alpha^{10}$ | | |
| $S_2 S_1$ is $\alpha^{10}$ | | |
| $S_1 S_0$ is $\alpha^{10}$ | | |
| Single Error Correction | | |
| The error is $\alpha^{37}$ | | |
| The error location is $\alpha^{10}$ in galois representation | | |
| This corresponds to location 9 in the block | | |

TABLE 11

Reed Solomon Decoder
Data Prior to Decoding

| Location | Data Byte | Galois Representation |
|---|---|---|
| 27 | 246 | $\alpha^{207}$ |
| 26 | 347 | $\alpha^{81}$ |
| 25 | 224 | $\alpha^{38}$ |
| 24 | 75 | $\alpha^{228}$ |
| 23 | 62 | $\alpha^{194}$ |
| 22 | 203 | $\alpha^{247}$ |
| 21 | 0 | 0 |

TABLE 11-continued

Reed Solomon Decoder
Data Prior to Decoding

| Location | Data Byte | Galois Representation |
|---|---|---|
| 20 | 71 | $\alpha^{154}$ |
| 19 | 176 | $\alpha^{167}$ |
| 18 | 337 | $\alpha^{90}$ |
| 17 | 54 | $\alpha^{240}$ |
| 16 | 365 | $\alpha^{231}$ |
| 15 | 212 | $\alpha^{222}$ |
| 14 | 373 | $\alpha^{234}$ |
| 13 | 30 | $\alpha^{28}$ |
| 12 | 161 | $\alpha^{94}$ |
| 11 | 126 | $\alpha^{219}$ |
| 10 | 327 | $\alpha^{170}$ |
| 9 | 304 | $\alpha^{183}$ |
| 8 | 255 | $\alpha^{252}$ |
| 7 | 342 | $\alpha^{95}$ |
| *6 | 20 | $\alpha^{4}$ |
| 5 | 60 | $\alpha^{29}$ |
| 4 | 251 | $\alpha^{135}$ |
| 3 | 223 | $\alpha^{119}$ |
| 2 | 154 | $\alpha^{250}$ |
| *1 | 227 | $\alpha^{124}$ |
| 0 | 107 | $\alpha^{253}$ |

$\alpha^{207}x^{27} + \alpha^{81}x^{26} + \alpha^{38}x^{25} + \alpha^{228}x^{24} + \alpha^{194}x^{23} + \alpha^{247}x^{22} + 0x^{21} + \alpha^{154}x^{20} + \alpha^{167}x^{19} + \alpha^{90}x^{18} + \alpha^{240}x^{17} + \alpha^{231}x^{16} + \alpha^{222}x^{15} + \alpha^{223}x^{14} + \alpha^{28}x^{13} + \alpha^{94}x^{12} + \alpha^{219}x^{11} + \alpha^{170}x^{10} + \alpha^{183}x^9 + \alpha^{252}x^8 + \alpha^{95}x^7 + \alpha^{4}x^6 + \alpha^{29}x^5 + \alpha^{135}x^4 + \alpha^{119}x^3 + \alpha^{250}x^2 + \alpha^{124}x + \alpha^{253}$

TABLE 12

| Syndrome calculation | | |
|---|---|---|
| Syndome 0 is | 254 | $\alpha^{220}$ |
| Syndome 1 is | 314 | $\alpha^{127}$ |
| Syndome 2 is | 267 | $\alpha^{158}$ |
| Syndome 3 is | 70 | $\alpha^{201}$ |
| Correction Routine | | |
| Check for One Error | | |
| $S_3/S_2$ is $\alpha^{43}$ | | |
| $S_2/S_1$ is $\alpha^{31}$ | | |
| $S_1/S_0$ is $\alpha^{162}$ | | |
| Check for Two Errors | | |
| The Error Locator Polynomial is | | |
| $\{S_0 S_2 + S_1 S_1\}x^2 + \{S_0 S_3 + S_1 S_2\}x + \{S_1 S_3 + S_2 S_2\}$ | | |
| $\alpha^{179}x^2 + \alpha^{64}x + \alpha^{188}$ | | |
| There are two errors | | |
| The first is at location $\alpha^2$ | | |
| It's value is $\alpha^{246}$ | | |
| The second is at location $\alpha^7$ | | |
| It's value is $\alpha^{163}$ | | |

TABLE 13

Reed Solomon Decoder
Data Prior to Decoding

| Location | Data Byte | Galois Representation |
|---|---|---|
| 27 | 246 | $\alpha^{207}$ |
| 26 | 347 | $\alpha^{81}$ |
| *25 | 107 | $\alpha^{253}$ |
| 24 | 75 | $\alpha^{228}$ |
| 23 | 62 | $\alpha^{194}$ |
| 22 | 203 | $\alpha^{247}$ |
| 21 | 0 | 0 |
| 20 | 71 | $\alpha^{154}$ |
| 19 | 176 | $\alpha^{167}$ |
| 18 | 337 | $\alpha^{90}$ |
| 17 | 54 | $\alpha^{240}$ |
| *16 | 26 | $\alpha^{239}$ |
| 15 | 212 | $\alpha^{222}$ |
| 14 | 373 | $\alpha^{234}$ |
| 13 | 30 | $\alpha^{28}$ |
| 12 | 161 | $\alpha^{94}$ |
| *11 | 371 | $\alpha^{214}$ |
| *10 | 60 | $\alpha^{29}$ |
| *9 | 303 | $\alpha^{216}$ |
| *8 | 302 | $\alpha^{67}$ |
| 7 | 342 | $\alpha^{95}$ |

TABLE 13-continued

Reed Solomon Decoder
Data Prior to Decoding

| Location | Data Byte | Galois Representation |
|---|---|---|
| 6 | 163 | $\alpha^{159}$ |
| 5 | 60 | $\alpha^{29}$ |
| 4 | 251 | $\alpha^{135}$ |
| *3 | 212 | $\alpha^{222}$ |
| 2 | 154 | $\alpha^{250}$ |
| 1 | 130 | $\alpha^{241}$ |
| 0 | 107 | $\alpha^{253}$ |

$\alpha^{207}x^{27} + \alpha^{81}x^{26} +$
$\alpha^{253}x^{25} + \alpha^{228}x^{24} +$
$\alpha^{194}x^{23} + \alpha^{247}x^{22} +$
$0x^{21} + \alpha^{154}x^{20} +$
$\alpha^{167}x^{19} + \alpha^{90}x^{18} +$
$\alpha^{240}x^{17} + \alpha^{239}x^{16} +$
$\alpha^{222}x^{15} + \alpha^{234}x^{14} +$
$\alpha^{28}x^{13} + \alpha^{94}x^{12} +$
$\alpha^{214}x^{11} + \alpha^{29}x^{10} +$
$\alpha^{216}x^{9} + \alpha^{67}x^{8} +$
$\alpha^{95}x^{7} + \alpha^{159}x^{6} +$
$\alpha^{29}x^{5} + \alpha^{135}x^{4} +$
$\alpha^{222}x^{3} + \alpha^{250}x^{2} +$
$\alpha^{241}x + \alpha^{253}$

TABLE 14

Syndrome calculation

| | | |
|---|---|---|
| Syndome 0 is | 11 | $\alpha^{223}$ |
| Syndome 1 is | 255 | $\alpha^{252}$ |
| Syndome 2 is | 236 | $\alpha^{137}$ |
| Syndome 3 is | 101 | $\alpha^{191}$ |

Correction Routine
Check for One Error
$S_3/S_2$ is $\alpha^{54}$
$S_2/S_1$ is $\alpha^{140}$
$S_1/S_0$ is $\alpha^{29}$
Check for Two Errors
The Error Locator Polynomial is
$\{S_0S_2 + S_1S_1\}x^2 + \{S_0S_3 + S_1S_2\}x + \{S_1S_3 + S_2S_2\}$
$\alpha^{240}x^2 + \alpha^{135}x + \alpha^{175}$
Multiple Errors

What is claimed:

1. A method for the detection and correction of errors in encoded digital data arranged in data bytes and encoded according to a BCH code, the method comprising the steps of:
    (a) for each data byte in a block of the encoded digital data, forming the product in a Galois field of a first said data byte and of a first power of a root of the primitive polynomial used in forming the encoded digital data of the block;
    (b) adding in a Galois field the product formed in the previous step to another said data byte of the block of the encoded digital data to form a sum and forming the product in a Galois field of the sum and the first power of the root of the primitive polynomial;
    (c) repeating the step (b) for all of the rest of the data bytes in the encoded digital data of the block to form a first representation of the number of errors, of the location of the errors and of the nature of the errors in the encoded digital data of the block;
    (d) repeating the steps (a), (b) and (c) for a plurality of other powers of the root of the primitive polynomial in order to obtain plural representations of the number, of the location, and of the nature, of errors in the encoded digital data of the block;
    (e) determining the number of errors in the encoded digital data of the block using the first representation and the plural representations formed in the steps (c) and (d);
    (f) locating the errors determined in the step (e) in the encoded digital data of the block using the representations formed in the steps (c) and (d); and
    (g) correcting errors in the encoded digital data of the block located in the step (f) using the representations calculated in the steps (c) and (d).

2. A method according to claim 1 comprising the steps of storing the digital data bytes in a memory and reading the digital data bytes from the memory during the step of forming the product.

3. A method according to claim 2 comprising the steps of:
    incrementing a counter through a sequence of states corresponding to the individual digital data bytes of the block and utilizing the states of the counter to select the corresponding digital data bytes from the memory for use in the steps (a) and (b).

4. A method according to claim 2 including the steps of:
    determining the representations formed during the steps (c) and (d) having values different from a predetermined value;
    determining whether ratios of the values of the representations have a further predetermined value;
    determining whether a predetermined relationship exists between the representations calculated in the steps (b) and (c) and the locations of digital data bytes in the memory; and
    using the results of the preceding three recited steps for determining the numbers of errors in the digital data.

5. A method according to claim 1 comprising the steps of sequentially incrementing the state of a counter for each of the different powers and using the states of the counter for selecting the power of the root of the primitive polynomial to be used in the steps (a) and (b).

6. A method according to claim 1 wherein the BCH code is a Reed-Solomon code.

7. Means for the detection and correction of errors in encoded digital data arranged by data bytes and encoded according to a BCH code, the means comprising:
    (a) means operative for each data byte in a block of the encoded digital data for forming the product in a Galois field of a first said data byte and of a first power of a root of the primitive polynomial used in forming the encoded digital data of the block;
    (b) means for adding in a Galois field the product formed in the previous step to another said data byte of the block of the encoded digital data to form a sum and forming the product in a Galois field of the sum and the first power of the root of the primitive polynomial;
    (c) means for enabling the means for adding to repeat the recited operation thereof for all of the rest of said data bytes in the encoded digital data of the block to form a first representation of the number of errors, of the location of the errors and of the nature of the errors in the encoded digital data of the block;
    (d) means for enabling the operation of the means (a), (b) and (c) to be repeated for each of a plurality of other powers of the root of the primitive polynomial in order to obtain plural representations of the number, of the location, and of the nature, of errors in the encoded digital data of the block;
(e) means for determining the number of errors in the encoded digital data of the block using the first representation and plural representations formed by the means (b) and (c);
(f) means for locating the errors determined by the means (e) in the encoded digital data of the block using the representations formed by the means (c) and (d); and
(g) means for correcting errors in the encoded digital data of the block located by the means (f) using the representations calculated by the means (c) and (d).

8. Means according to claim 7 comprising:
means for storing the digital data bytes in a memory and for reading the digital data bytes from the memory for use by the means for forming the product.

9. Means according to claim 8 comprising:
a counter incremented through a sequence of states corresponding to the individual digital data bytes of the block and means for utilizing the states of the counter to select the corresponding digital data bytes of the block from the memory for use by the means (c) and (d).

10. Means according to claim 8 comprising:
(a) means for determining the representations formed by the means (b) and (c) having values different from a predetermined value;
(b) means for determining whether ratios of the values of the representations have a further predetermined value;
(c) means for determining whether a predetermined relationship exists between the representations calculated by the means (b) and (c) and the locations of digital data bytes in the memory; and
(d) means for using the results of the preceding three recited means for determining the number of errors in the encoded digital data of the blocks.

11. Means according to claim 7 comprising:
a counter that is sequentially incremented for each of the different powers and means for using the states of the counter for selecting the power of the root of the primitive polynomial to be used by the means (a) and (b).

12. Means according to claim 7 wherein the BCH code is a Reed-Solomon code.

13. A method for correcting byte errors in a plurality of bytes of data which data is encoded in a cross interleaved Reed-Solomon Code, the steps comprising:
addressing an addressable memory which is storing the data to read out the data bytes in a first sequence of blocks and to read out the data bytes in a second sequence of blocks which overlaps in data bytes with the first sequence of blocks, each said block having a combination of the data bytes which is different from the other said blocks;
processing the data bytes in each said block with Galois calculations to form, for individual ones of each said first and second blocks, a representation of the position of at least one said byte which is in error in a particular one of the blocks and a further representation; and
modifying, in accordance with the further representation, the information content of the addressable memory at a location in the memory indicated by said representation of the position.

14. The method of claim 13 wherein the further representation comprises an error byte and the step of modifying comprises the step of combining the error byte with the data byte which is in error to form a corrected data byte for said particular block in the addressable memory.

15. The method of claim 14 comprising the step of selecting and replacing, in the addressable memory, the data byte which is in error with the corrected data byte using the representation of a position.

16. The method of claim 14 wherein the data step of processing comprises the step of processing the data bytes of the blocks in accordance with the following equation:

$$S_J = L_0 * \alpha^{J \cdot (M)} + L_1 * \alpha^{J \cdot (M-1)} + ---L_{M-1} * \alpha^{J \cdot (1)} + L_M * \alpha^O$$

where
$S_J$ is a syndrome
J ranges from 0 to P
P is the total number of syndromes less 1
L is the data byte
M is the number of bytes in a block less 1
"*" means Galois multiplication
"." means ordinary multiplication
$\alpha$ is an irreducible root of a primitive polynomial and where said representation of the position and the further representation are derived using said syndromes $S_J$.

17. The method of claim 16 comprising the step of varying the value of J from 0 to 3.

18. The method of claim 16 comprising the step of selecting the values of $\alpha^0$ to $\alpha^{J \cdot (M)}$ from a stored memory of such values.

19. The method of claim 16 wherein the step of processing comprises the step of solving the equation $$0 = (S_0 * S_2 + S_1^2) * A_1^2 + (S_0 * S_3 + S_1 * S_2) * A_1 + (S_1 * S_3 + S_2^2)$$

where the value of $A_1$ is a Galois representation that makes the equation equal 0.

20. The method of claim 13 comprising the steps of forming a first sequence of addresses of locations for the data bytes in the addressable memory, forming a second sequence of addresses for the location of the data bytes in the addressable memory, reading out the data bytes in the addressed locations for use in the step of processing, one of the first and second sequence of addresses being for locations in the addressable memory which contains the data bytes which have previously been read out, processed and if necessary modified in the steps of reading out, processing and modifying, respectively.

21. The method of claim 20 wherein each of the steps of addressing, address locations passing from a beginning to an end and back to the beginning of the locations for the data bytes in said addressable memory.

22. The method of claim 21 comprising the step of addressing the addressable memory and outputting data bytes from said addressable memory after such data bytes have been processed in said step of processing.

23. The method of claim 22 comprising the steps of addressing the addressable memory and storing new bytes of data in those locations from which data bytes have been outputted in the step of outputting.

24. Means for correcting byte errors in a plurality of bytes of data which data is encoded in a cross interleaved Reed-Solomon Code, comprising:
addressable memory means for storing the data;
means for addressing the addressable memory and for reading out the data bytes in a first sequence of blocks and for reading out the data bytes in a second sequence of blocks which overlaps in data bytes with the first sequence of blocks, each said block having a combination of the data bytes which is different from the other said blocks;
means for processing the data bytes in each said block with Galois calculations to form, for individual ones of each said first and second blocks, a representation of the position of at least one said data byte which is in error in a particular one of the blocks and a further representation; and
means for modifying, in accordance with the further representation, the information content of the addressable memory at a location in the addressable memory indicated by said representation of the position.

25. The means of claim 24 wherein the further representation comprises an error byte and the means for modifying comprises means for combining the error byte with the data byte which is in error to form a corrected data byte for said particular block in the addressable memory.

26. The means of claim 25 comprising means for selecting and replacing, in the addressable memory, the data byte which is in error with the corrected data byte using the representation of a position.

27. The means of claim 25 wherein the means for processing comprises means for processing the data bytes of the blocks in accordance with the following equation:

$$S_J = L_0 * \alpha^{J \cdot (M)} + L_1 * \alpha^{J \cdot (M-1)} + \cdots - L_{M-1} * \alpha^{J \cdot (1)} + L_M * \alpha^0$$

where
$S_J$ is a syndrome
J ranges from 0 to P
P is the total number of syndromes less 1
L is the data byte
M is the number of bytes in a block less 1
"*" means Galois multiplication
"." means ordinary multiplication
$\alpha$ is an irreducible root of a primitive polynomial and where said representation of the position and the further representation are derived using said syndromes $S_J$.

28. The means of claim 27 comprising means for varying the value of J from 0 to 3.

29. The means of claim 27 comprising means for selecting the values of $\alpha^0$ to $\alpha^{J \cdot (M)}$ from a stored memory of such values.

30. The means of claim 24 comprising means for forming a first sequence of addresses of locations for the data bytes in the addressable memory, means for forming a second sequence of addresses for the locations of the data bytes in the addressable memory, means for reading out the data bytes in the addressed locations for use by the means for processing, one of the first and second sequences of addresses being for locations in the addressable memory which contains the data bytes which have previously been read out, processed and if necessary modified by the means for reading out, the means for processing and the means for modifying, respectively.

31. The means of claim 30 wherein each of the means for addressing, address locations passing from a beginning to an end and back to the beginning of the locations for the data bytes in said addressable memory.

32. The means of claim 31 comprising means for addressing the addressable memory and outputting data bytes from said addressable memory after such data bytes have been processed in said step of processing.

33. The means of claim 32 comprising means for addressing the addressable memory and means for storing new bytes of data in those locations from which data bytes have been outputted in the step of outputting.

34. The means of claim 33 comprising means for locating the position of the data bytes which are in error by solving the equation:

$$0 = (S_0 * S_2 + S_1^2) * A_1^2 + (S_0 * S_3 + S_1 * S_2) * A_1 + (S_1 * S_3 + S_2^2)$$

where the value of $A_1$ is a Galois representation that makes the equation equal 0.

* * * * *

UNITED STATES PATENT AND TRADEMARK OFFICE
CERTIFICATE OF CORRECTION

PATENT NO. : 4,637,021

DATED : January 13, 1987

INVENTOR(S) : David N. Shenton

It is certified that error appears in the above-identified patent and that said Letters Patent is hereby corrected as shown below:

Column 2, line 31, after "expressed in" insert -- terms --.
Column 9, line 54, change "consistsd" to -- consisted --.
Column 14, line 30, below the "dashes" in the example add the phrase -- Y position 255 contains bytes 8160-8191 --.
Column 16, line 62, after "complete" delete the ".".
Column 18, line 59, change the heading "Decoder" to -- C1 Decoder --.
Column 19, line 21, change "addresss" to --address--.
Column 20, line 59, after $S_3$ insert -- in buffers $S_0$ through $S_3$ of RAM 37 --.
Column 21, line 14, change "$S_1/S_0$" to -- $S_1/S_0$ --.
Column 21, line 26, after "detail" insert -- in --; after "with" delete "in".
Column 21, line 37, change the equation "$B1=(S_0*S_2 S_1{}^2)*A1^2+(S_0*S_3+S_1*S_2)*A1+(S_1*S_3+S_2{}^2)$" to -- $B1=(S_0*S_2+S_1{}^2)*A1^2+(S_0*S_3+S_1*S_2)*A1+(S_1*S_3+S_2{}^2)$ --.
Column 21, line 53, change the equation "$G1=S_0*S_0*S_3+S_1+S_2$" to -- $G1=S_0*S_3+S_1+S_2$ --.
Column 21, line 55, change the equation "$G2=S_1*S_1*S_3+S_2{}^2$" to -- $G2=S_1*S_3+S_2{}^2$ --.
Column 24, line 10, change "previsouly" to -- previously --.
Column 24, line 11, after "up to" insert -- two --.
Column 25, line 33, change "block" to -- blocks --.
Column 26, lines 14,16, change "C20FST" to -- C2OFST --.
Column 27, line 3, change "is" to -- are --.
Column 27, line 11, change "is" to -- are --.
Column 27, line 21, after "FIG. 8" and before the period insert -- ) --.
Column 31, line 60 (Col. 2), change "80" to -- 30 --.
Column 32, line 8 (Col. 4), change "82" to -- 32 --.
Column 33, line 19, change "$\alpha^{124}_{142}$" to -- $\alpha^{189}_{194}$ --.
Column 33, line 41, change "$\alpha^{142}$" to -- $\alpha^{194}$ --.
Column 34, line 33, after "$\alpha^{222}x^{15}$" insert -- $+\alpha^{234}x^{14} + \alpha^{28}x^{13} + \alpha^{94}x^{12} + \alpha^{219}x^{11} + \alpha^{170}x^{10} + \alpha^{183}x^{9}$ --.

UNITED STATES PATENT AND TRADEMARK OFFICE
CERTIFICATE OF CORRECTION

PATENT NO. : 4,637,021
DATED : January 13, 1987
INVENTOR(S) : David N. Shenton

It is certified that error appears in the above-identified patent and that said Letters Patent is hereby corrected as shown below:

Column 34, line 65, change " = " to -- + --.
Column 35, lines 52,53, change "$S_2S_1$" to -- $S_2/S_1$ --.
Column 36, line 24, change " $\alpha^{223}$ " to -- $\alpha^{234}$ --.

Column 36, lines 43,45, change "It's" to --Its --.
Column 39, line 67, after "location in the" insert -- addressable --.
Column 40, line 18, change "$\alpha^O$" to -- $\alpha^0$ --.

Signed and Sealed this

Twenty-second Day of March, 1988

*Attest:*

DONALD J. QUIGG

*Attesting Officer*     *Commissioner of Patents and Trademarks*